(12) United States Patent
Nishida et al.

(10) Patent No.: US 6,950,360 B2
(45) Date of Patent: Sep. 27, 2005

(54) MEMORY CIRCUIT APPARATUS

(75) Inventors: Yukihiro Nishida, Yokohama (JP);
Kiyoharu Oikawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 59 days.

(21) Appl. No.: 10/700,552

(22) Filed: Nov. 5, 2003

(65) Prior Publication Data

US 2004/0141394 A1 Jul. 22, 2004

(30) Foreign Application Priority Data

Nov. 6, 2002 (JP) ...................................... 2002-322887

(51) Int. Cl.[7] .............................................. G11C 7/00
(52) U.S. Cl. .................... 365/203; 365/185.25
(58) Field of Search .......................... 365/203, 185.25, 365/185.11, 185.23

(56) References Cited

U.S. PATENT DOCUMENTS

| | | | |
|---|---|---|---|
| 4,661,728 A | * 4/1987 | Kashimura | 326/44 |
| 5,270,978 A | * 12/1993 | Matsumoto et al. | 365/203 |
| 5,453,955 A | 9/1995 | Sakui et al. | 365/203 |
| 5,687,123 A | 11/1997 | Hidaka et al. | 365/189.09 |
| 5,949,727 A | * 9/1999 | Choi et al. | 365/203 |
| 6,018,487 A | * 1/2000 | Lee et al. | 365/204 |
| 6,058,044 A | 5/2000 | Sugiura et al. | 365/185.17 |
| 6,072,734 A | * 6/2000 | Choi | 365/194 |
| 6,195,297 B1 | 2/2001 | Sano | 365/189.11 |

* cited by examiner

Primary Examiner—Tan T. Nguyen
(74) Attorney, Agent, or Firm—Oblon, Spivak, McClelland, Maier & Neustadt, P.C.

(57) ABSTRACT

A memory circuit device comprising a plurality of memory cells connected to a plurality of bit lines and word lines, an access circuit connected to the plurality of bit lines and word lines to select predetermined memory cells from the plurality of memory cells in response to an address signal, a precharge circuit which precharges the bit lines connected to the memory cells selected by the access circuit at the time of a read mode, a common source line connected to a plurality of selected memory cells selected by the access circuit, a source line potential control circuit to connect the common source line to a ground node at a predetermined timing, and a discharge circuit which discharges the bit lines connected to non-selected memory cells other than the selected memory cells.

11 Claims, 13 Drawing Sheets

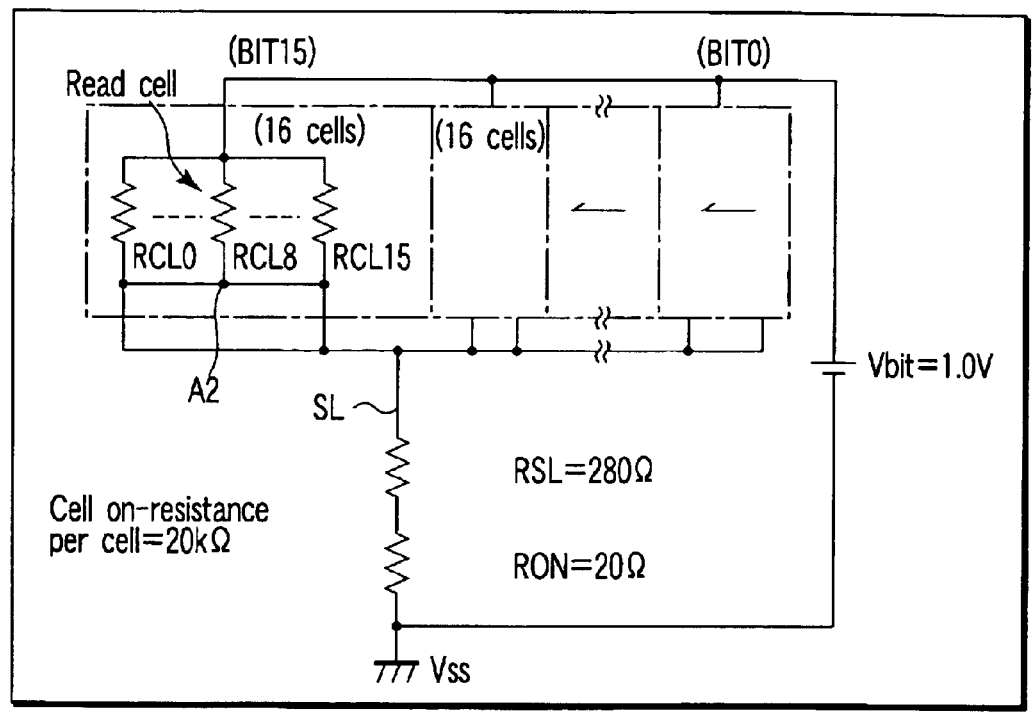
F I G. 3

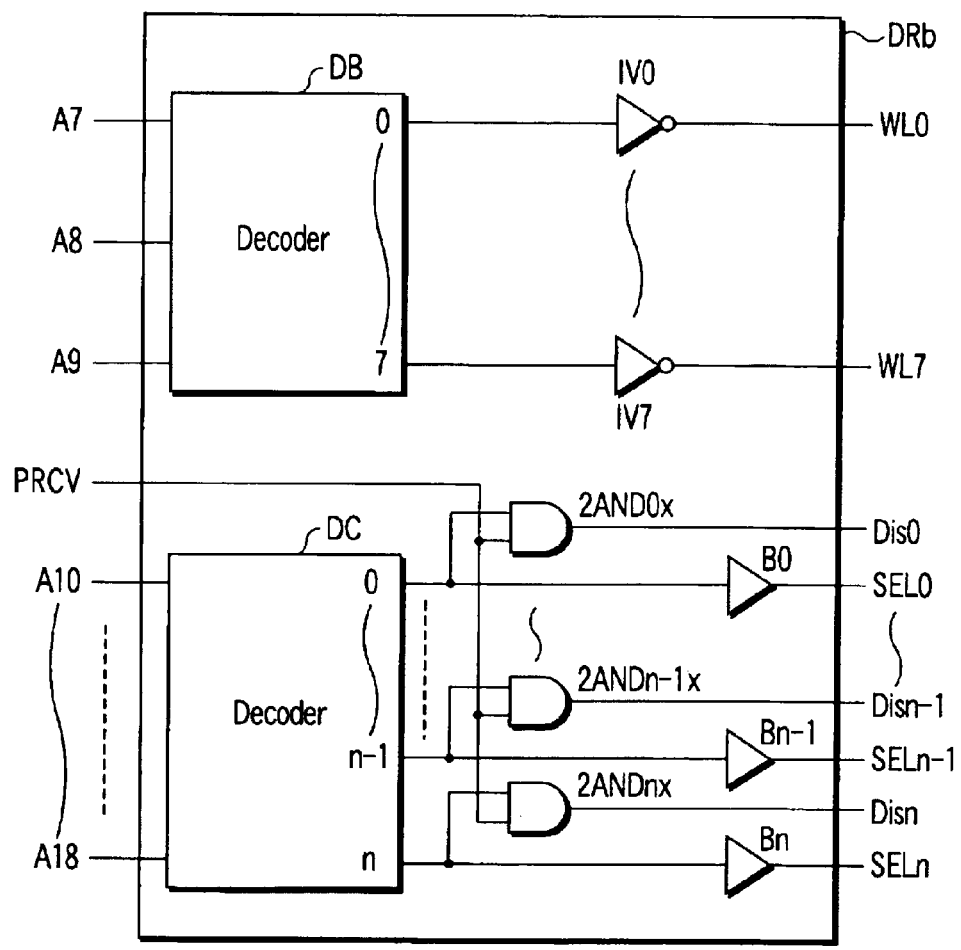
F I G. 22

US 6,950,360 B2

MEMORY CIRCUIT APPARATUS

CROSS-REFERENCE TO RELATED APPLICATIONS

This application is based upon and claims the benefit of priority from the prior Japanese Patent Application No. 2002-322887, filed on Nov. 6, 2002, the entire contents of which are incorporated herein by reference.

BACKGROUND OF THE INVENTION

1. Field of the Invention

The present invention relates to a memory circuit apparatus, particularly to a memory circuit apparatus including a memory cell array in which a discharge current flows through a common source line from precharged bit lines via selected memory cells at the time of read.

2. Description of the Related Art

A conventional non-volatile memory device described in U.S. Pat. No. 5,453,955, for example, includes read charging transistors for setting bit lines at a predetermined read potential to perform a data read operation, and read discharging transistors for setting non-selected bit lines at the ground potential during the read operation. A similar non-volatile memory device also described in U.S. Pat. No. 6,195,297.

In a data read operation of the non-volatile memory device, bit lines are first precharged and are subsequently set in a floating state, and then data items are read through the bit lines. When many selected cells are on-cells, many charges on the corresponding bit lines are discharged, so that a ground line should be designed to have a big capacity. This is a problem to be solved when a large-scale integration of a memory circuit apparatus is demanded.

BRIEF SUMMARY OF THE INVENTION

According to one aspect of the present invention, there is provided a memory circuit apparatus comprising a plurality of memory cells connected to a plurality of bit lines and word lines; an access circuit connected to the plurality of bit lines and word lines to select predetermined memory cells from the plurality of memory cells in response to an address signal; a precharge circuit which precharges the bit lines connected to the memory cells selected by the access circuit at the time of a read mode; a common source line connected to a plurality of selected memory cells selected by the access circuit; a source line potential control circuit to connect the common source line to a ground node at a predetermined timing; and a discharge circuit which discharges the bit lines connected to non-selected memory cells other than the selected memory cells.

BRIEF DESCRIPTION OF THE SEVERAL VIEWS OF THE DRAWING

FIG. 3 is an equivalent circuit diagram at the time of the read of the memory cells all in the on-state after 16 bit lines are precharged in the memory circuit apparatus shown in FIG. 1;

FIG. 22 is a block diagram showing a circuit constitution example of the row decoder shown in FIG. 20.

DETAILED DESCRIPTION OF THE INVENTION

Embodiments of the present invention will hereinafter be described with reference to the drawings.

Figure 1:
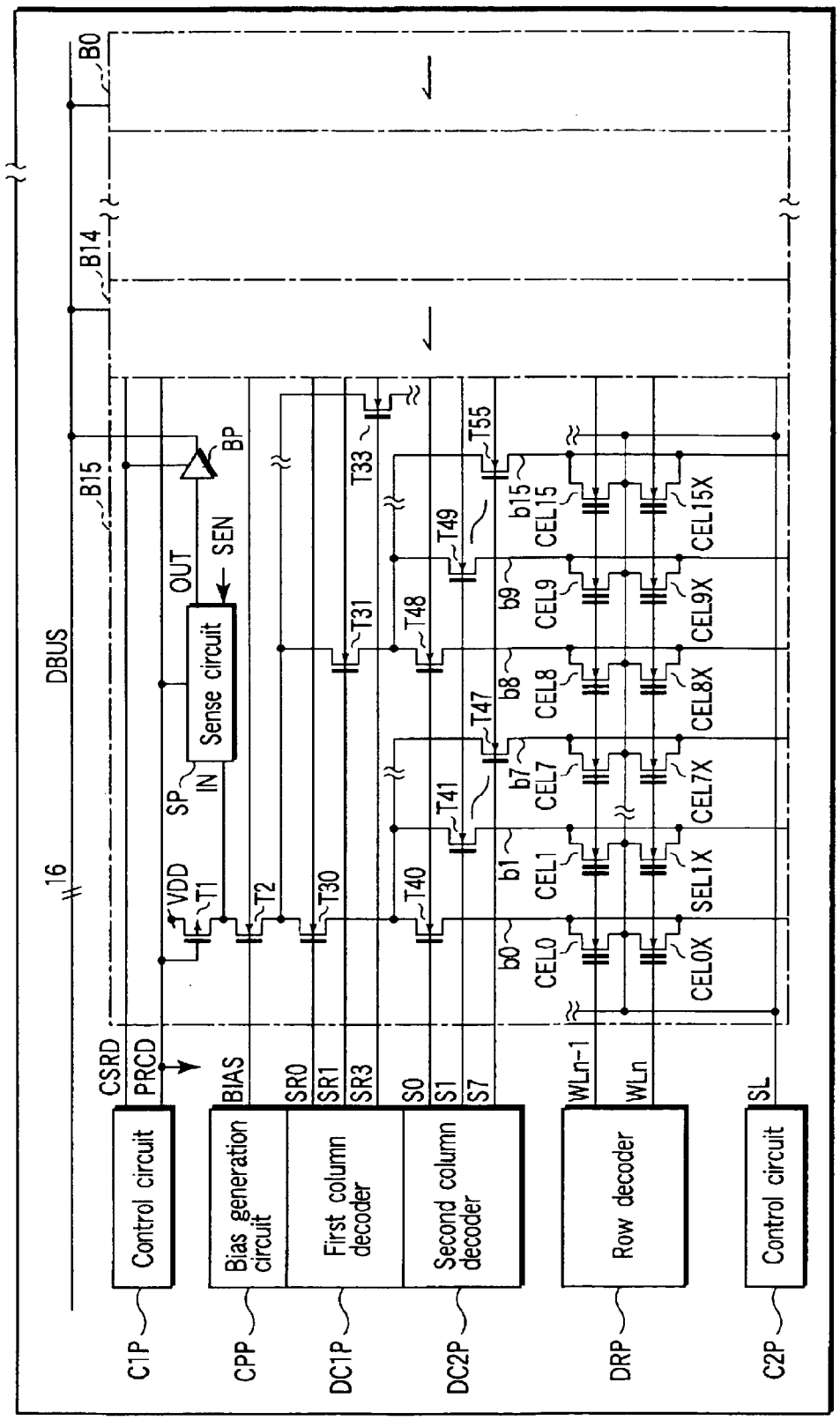
FIG. 1 is a block diagram showing a constitution of a proposed memory circuit apparatus.

FIG. 1 shows a memory circuit apparatus including a constitution in which a discharge current flows through a common source line from precharged bit lines via selected memory cells at the time of read.

This memory circuit apparatus is a FLASH_E²PROM (electrically erasable and programmable ROM) of a clock synchronous system. It is to be noted that this circuit apparatus shows only a constitution concerning read, and a circuit concerning a write/erase operation is omitted for the sake of simplicity.

Figure 2:
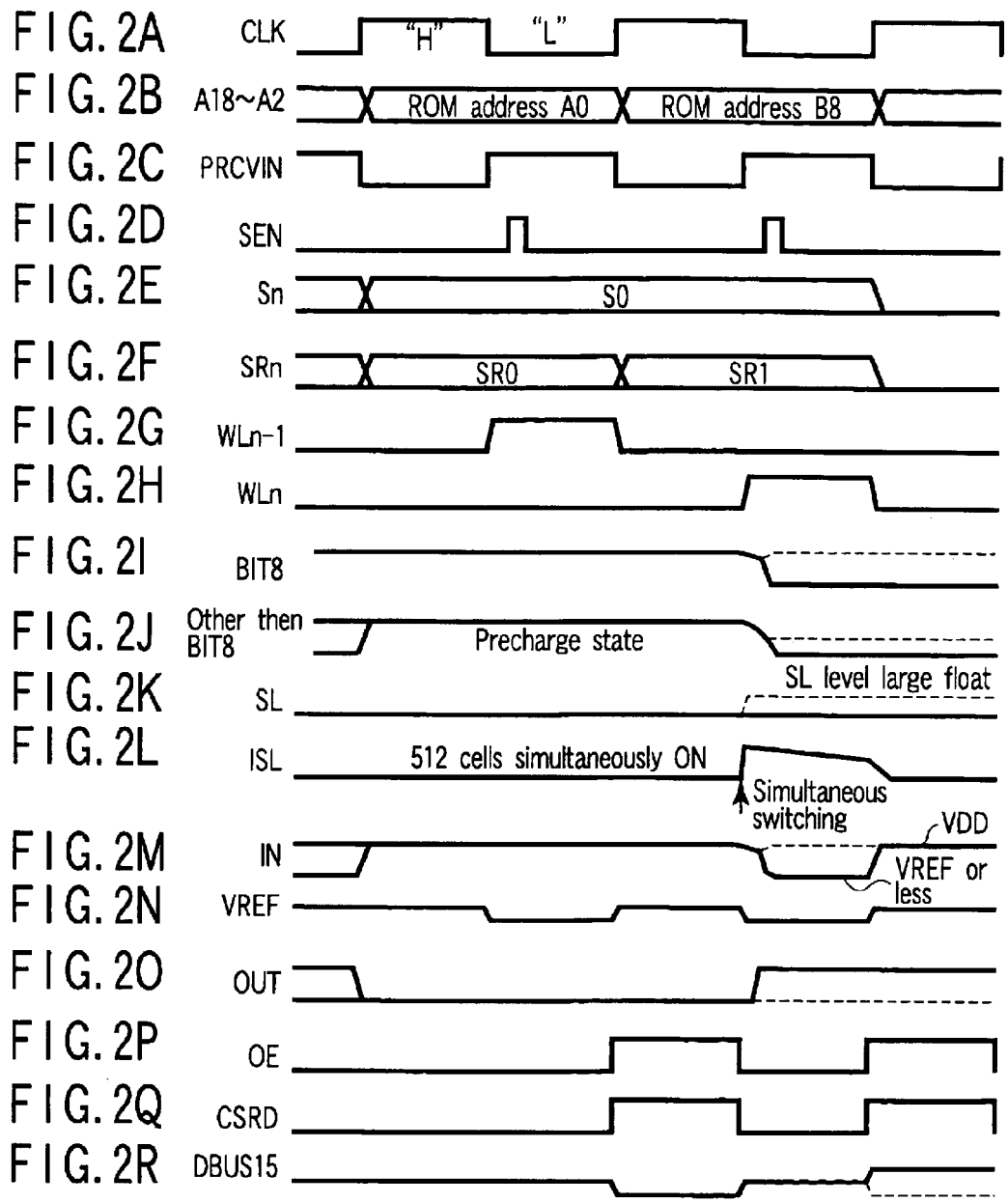
FIGS. 2A to 2R are timing charts showing an operation of the memory circuit apparatus shown in FIG. 1.

FIGS. 2A to 2R show timing charts showing a read operation of this FLASH_E²PROM circuit shown in FIG. 1, and FIG. 3 shows an equivalent circuit diagram at the time of all-on-cell read after all bit lines are precharged.

In FIG. 1, it is assumed that 512 nonvolatile memory cells including memory cells CEL0 to CEL15 connected to a word line WLn-1 selected by a row decoder DRP which decodes an address signal (not shown) are all memory cells having an off-state (data "0") and that 512 memory cells including memory cells CEL0X to CEL15X connected to a word line WLn are all in an on-state (data "1"). It is also assumed that first the word line WLn-1 is selected by an address signal and next the word line WLn is selected. That is, since all the first selected 16 memory cells CEL0 to CEL15 are in the off-state, potentials of bit lines b0 to b15 connected to these memory cells maintain a precharge state even after a read operation is performed. Similarly, all the bit lines selected by the word line WLn-1 are in the precharged state. In this state, since the memory cells CEL0X to CEL15X to be read next are all in the on-state, all the precharged bit lines b0 to b15 are discharged at the time of the read. At this time, 512 bit lines are similarly discharged.

The time of an operation mode in this case will be described in more detail.

In FIG. 1, prior to the read of the memory cells CEL0 to CEL15 disposed in one memory block, a transistor T1 turns on by a precharge signal PRCV from a control circuit C1P, and power is supplied to an input terminal IN of a sense circuit SP and also to a transistor T2 for power saving from a VDD power supply which is a precharge power supply.

This transistor T2 turns on by a bias signal BIAS from a bias generation circuit CPP, and selector transistors T30 to T33 in this memory block B15 are selectively turned on by column decode signals SR0 to SR3 from a first column decoder DC1P. It is to be noted that this bias signal BIAS is supplied to all memory blocks B0 to B15, and the blocks are simultaneously selected by the column decode signals SR0 to SR3 from the first column decoder DC1P.

The transistor T30 is connected to eight bit lines b0 to b7 via eight transistors T40 to T47 selected by decode signals S0 to S7 from a second column decoder DC2P. Therefore, when the transistors T40 to T47 are selectively turned on, eight bit lines b0 to b7 are successively precharged by the transistor T30. Bit lines b8 to b31 in the same block B15 are also selectively precharged via the transistors T31 to T33 and transistors T48 to T55. Also with respect to the remaining blocks B0 to B14, the respective bit lines are similarly selectively precharged. That is, there are 32 bit lines per block, and 512 bit lines are successively precharged in 16 blocks in total.

An operation of the read circuit shown in FIG. 1 will hereinafter be described with reference to FIGS. 2A to 2R and FIG. 3.

In the time charts of FIGS. 2A to 2R, the selected bit line is precharged in a period in which a clock signal CLK of 2A has an H level. In a period of an L level, with respect to this bit line, memory cell read data is verified and sensed. Further in a period in which a system read control signal OE of FIG. 2P inputted into a control circuit C1P has the H level, an output of the sense circuit SP is outputted to a data bus DBUS via a buffer BP.

In the conventional circuit example of FIG. 1, as shown in FIG. 2B, the data is read in order of ROM address A0→ROM address B8. In this case, all the memory cells are off-cells. Therefore, in one period of the clock CLK until the read period of the ROM address A0 ends, 512 bit lines of 32 bit lines×16 blocks per block are all precharged, and the state is maintained.

Thereafter, at the time of on-cell read in the ROM address B8, all the memory cells connected to 512 bit lines are the on-cells, and therefore the precharged electric charges flow as a large current through a common source line SL via all the memory cells. Therefore, mainly by a parasitic resistance between the common source line SL and VSS ground, the level of the common source line SL floats in the vicinity of the level of the bit line in the precharge state as shown in FIG. 2K. In this case, assuming that a memory cell current in the on-state per cell is 50 $\mu$A, a total on-cell current flowing through the common source line SL indicates an excessively large current value of 25 mA.

An extreme example in which the read of all the on-cells follows the read of all the off-cells has been described above. However, when the read of a certain number of on-cells is performed following the read of a certain number of off-cells, there is similarly a large possibility that float phenomenon of the source line level is caused by a large current flowing through the common source line SL via the on-cell.

At the time of the read of the on-cell, an IN potential of FIG. 2M should originally drop to be not more than VREF potential of 2N. For the above-described reasons, the IN potential substantially indicates a VDD level as shown by a broken line in 2L. As a result, read data into the data bus DBUS which is to be "1" turns to "0", and a problem that the data is erroneously read as off-cell data.

In this manner, for a memory-loaded memory control unit (MCU) of this conventional example, a fatal problem of a system disadvantage has been caused by on-cell erroneous read because of the level float of the common source line SL.

As one example, calculated values at the time of the SL level float in an equivalent circuit shown in FIG. 1 are indicated.

Precharge potential Vbit of the bit line=1.0 V

Resistance value RCL8 of one on-cell=20 k$\Omega$

Synthesized resistance value RCLall of 512 on-cells=39 $\Omega$

Parasitic resistance RSLA between point A2 and SL and VSS=300 $\Omega$

Potential of point A2=(RSLA/(RCLall+RSLA))×Vbit= 0.88 V

In this manner, the potential of the point A2 should originally be VSS, but the potential rises to 0.88 V, and there is a problem that this causes the erroneous read.

It is to be noted that a channel width W of the transistor for use in an SL control circuit C2P is considered to be increased in order to reduce the parasitic resistance RSLA, but this has limitation. Moreover, because of macro size restriction, in design of layout, it is remarkably difficult reduce the parasitic resistance between the SL line and VSS.

Figure 4:
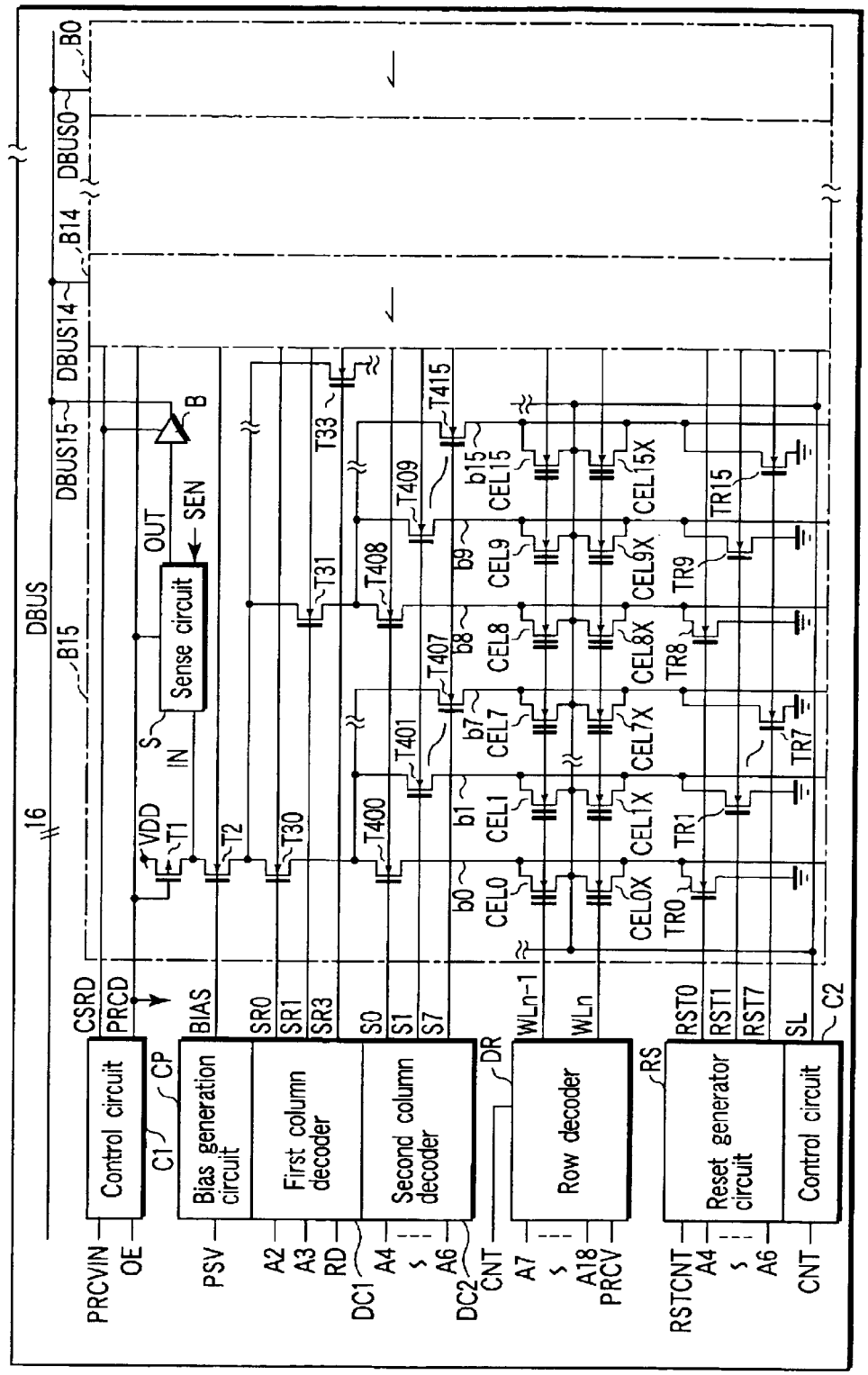
FIG. 4 is a block diagram showing a constitution of a read circuit section of a memory circuit apparatus according to one embodiment of the present invention.

FIG. 4 is a diagram showing one example of a FLASH-E$^2$PROM circuit constitution according to one embodiment of a memory circuit apparatus of the present invention. In FIG. 4, only a circuit part of a read system in the FLASH-E$^2$PROM circuit of a clock synchronous system of the first embodiment is shown, and the circuit of a write/erase system is omitted in order to avoid complicated description.

The FLASH-E$^2$PROM circuit of the embodiment shown in FIG. 4 comprising: a control circuit C1; a bias generation circuit CP for power saving; a first column decoder DC1 which is a selector control circuit for read; a second column decoder DC2 for a column selector for selecting a bit line; a row decoder DR for selecting a memory cell; a reset circuit RS for controlling a potential of the bit line; a control circuit C2 of a common source line SL; and a group of 16 memory blocks B0 to B15 forming a memory cell array.

Moreover, in FIG. 4, each memory block group comprises a set of 16 blocks B0 to B15 each including 32 bit lines, but the number of blocks and the number of bit lines are determined as required. This embodiment includes a constitution in which 512×512 memory cells are divided into 16 blocks.

The constitution of the memory block B15 as an example will be described.

Figure 16:
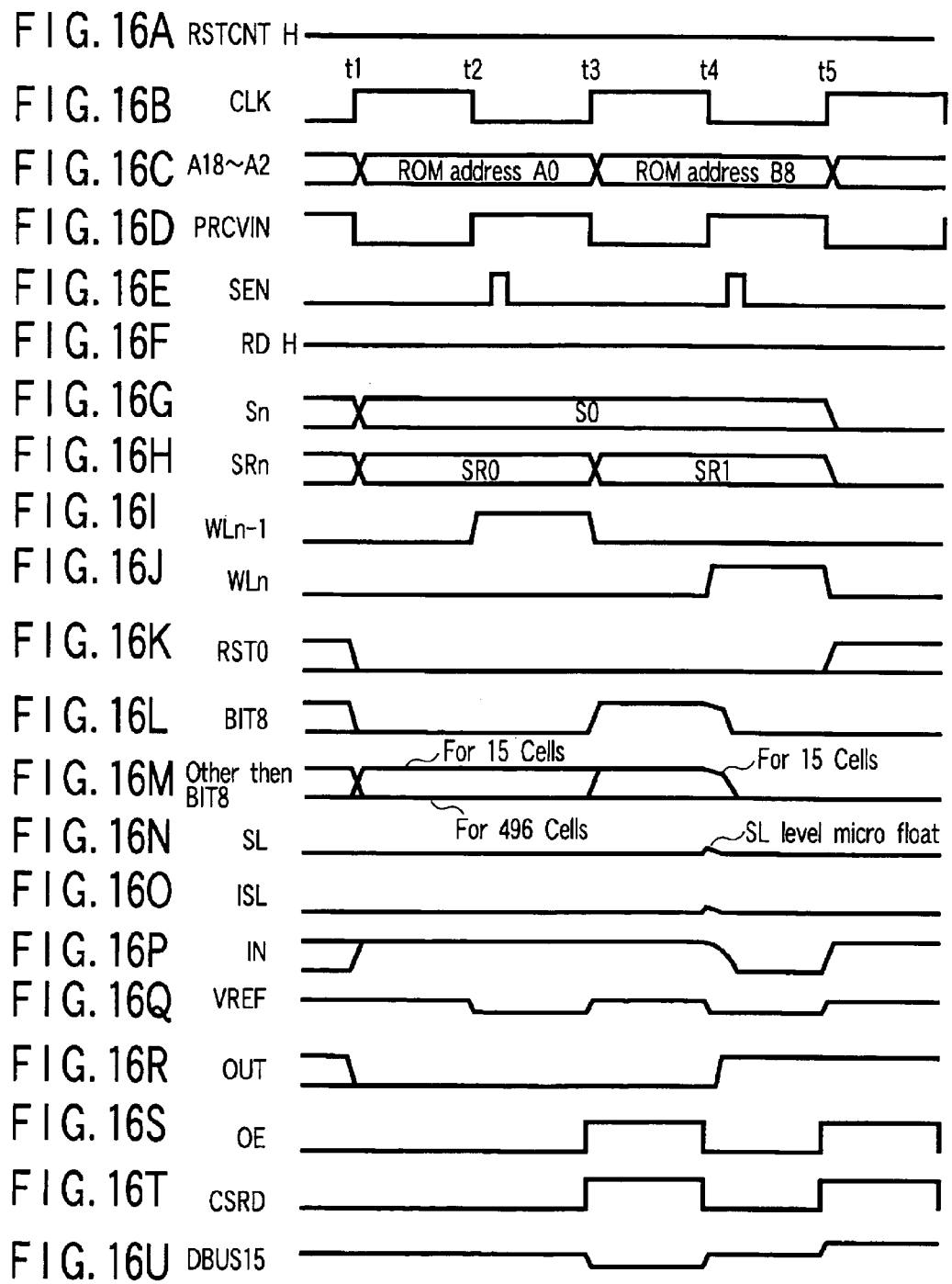
FIGS. 16A to 16U are timing charts showing an operation of an embodiment of the memory circuit apparatus of the present invention shown in FIGS. 4 to 15.

To the control circuit C1, a precharge control signal PRCVIN and system read control signal OE of FIG. 16D having a polarity reverse to that of a clock signal CLK of FIG. 16B are supplied. Based on these signals, the control circuit C1 outputs a read instruction signal CSRD and precharge signal PRCV. The read instruction signal CSRD is supplied as an output instruction signal to a buffer circuit B for data output of the memory block B15, and is similarly supplied also to data output buffer circuits similarly disposed in the other memory blocks B14 to B0. The precharge signal PRCV is supplied as a precharge instruction signal to a gate of a precharge transistor T1 of the memory block B15, and is similarly supplied also to the corresponding precharge transistors of the other memory blocks B14 to B0.

Further in the memory block B15, a bias transistor T2 is connected in series to a VDD power supply which is a precharge power supply via the precharge transistor T1, and selector transistors for read T30 to T33 are connected in parallel with this bias transistor T2.

A connection node between the transistors T1, T2 is connected to a sense input terminal IN of a sense circuit S, the sense circuit S performs a sense operation of an input signal based on a sense enable signal SEN shown in FIG. 16E, and a sense output OUT is outputted to a data bus DBUS15 via a data output buffer circuit B. The other memory blocks B14 to B0 are also similarly constituted.

A bias signal BIAS generated from the bias generation circuit CP is supplied to the gate of the bias transistor T2 in response to a power save signal PSV, and this transistor T2 turns on. One bias transistor T2 is disposed in each of the memory blocks B15 to B0. When the power save signal PSV is off, 16 bias transistors simultaneously turn on by this bias signal BIAS, and are connected to the VDD power supply.

The bias transistor T2 is connected in common to four selector transistors T30 to T33 in the memory block B15. Additionally, here a transistor T32 is omitted. Selection signals SR0 to SR3 from the first column decoder DC1 are supplied to the gates of these transistors T30 to 33 to obtain an on-state. Address signals A2, A3 are supplied to the first column decoder DC1 together with a read control signal RD, and the decoder is selectively brought into the on-state in accordance with contents of the address signals A2, A3.

These selector transistors T30 to T33 are similarly disposed in the other memory blocks B14 to B0, and 16 transistors are successively brought into the on-state in the whole block in accordance with a combination of the address signals A2, A3 by the selection signals SR0 to SR3 from the first column decoder DC1.

Eight column selector transistors T400 to T407 are connected in parallel with the selector transistor T30, and eight column selector transistors T408 to T415 are similarly connected to the selector transistor T31. Similarly, eight column selector transistors are also connected to each of the selector transistors T32, T33. In this manner, in this memory block B15, eight column selector transistors are connected to the VDD power supply at once by each of four selector transistors T30 to T33.

Similarly in the other memory blocks B14 to B0, four selector transistors are successively turned on by output signals SR0 to SR3 of the first column decoder DC1, and accordingly eight of 32 column selector transistors are successively connected to the VDD power supply.

In the memory block B15, eight selection signals S0 to S7 are supplied to the gates of the column selector transistors T400 to T407 connected to the selector transistor T30 from the second column decoder DC2 which receives three bits of address signals A4 to A6 to operate, and the transistors are successively brought into the on-state. The column selector transistors T400 to T407 are connected to the bit lines b0 to b7, respectively.

Similarly, eight selection signals S0 to S7 from the second column decoder DC2 are supplied to the gates of the column selector transistors T408 to T415 connected to the selector transistor T31, and the transistors are successively brought into the on-state. The column selector transistors T408 to T415 are connected to bit lines B8 to B15, respectively.

Similarly for the remaining selector transistors T32, T33, eight column selector transistors are connected, eight selection signals S0 to S7 from the second column decoder DC2 are supplied to the gates, and the column selector transistors are successively brought into the on-state. These column selector transistors are connected to eight bit lines, respectively.

Therefore, in the memory block B15, four transistors including the column selector transistors T400, T408 are turned on, for example, by one selection signal S0 of the second column decoder DC2. However, the corresponding selector transistors T30 to T33 are not simultaneously turned on, and any one transistor is only turned on by the content of the address signal. Therefore, in one block B15, only one of four bit lines including bit lines b0, b8 is connected to the VDD power supply and precharged. This also applies to the other selection signals S1 to S7.

Similarly with respect to the other memory blocks B14 to B0, one selector transistor per memory block is brought into the on-state by the outputs SR0 to SR3 of the first column decoder DC1. Therefore, one bit line per memory block is precharged by the VDD power supply selected by the second column decoder DC2. Therefore, 16 bit lines in total are only precharged simultaneously in the whole memory cell array.

In the block B15, bit lines b0 to b15 are connected to the common source line SL via a first group of memory cells CEL1 to CEL15, and connected to the common source line SL via a second group of memory cells CEL0X to CEL15X connected in parallel with the first group memory cells CEL1 to CEL15. Therefore, the memory cells CEL0 and CEL0X are connected in parallel, that is, OR-connected, for example, to the bit line b0.

Similarly with respect to the remaining 16 bit lines (not shown) in the memory block B15 or all the bit lines in the other memory blocks B14 to B0, two memory cells are OR-connected to one bit line. The memory cell for use here is a nonvolatile memory cell including a MOS structure which includes a floating gate and control gate.

In the memory block B15, the respective control gates of the first group of memory cells CEL0 to CEL15 are connected in common to a word line WLn-1 connected to the row decoder DR, and the control gates of the second group of memory cells CEL0X to CEL15X are connected in common to the word line WLn.

The row decoder DR receives a control signal CNT and the above-described precharge signal PRCV together with 12 bits of address signals A7 to A18, and sends an address designation signal of a row direction, that is, a memory cell selection signal to a plurality of word lines. In this embodiment, the total number of word lines is 512, but in FIG. 4, only two word lines WLn-1, WLn are shown. Similarly, a decode output of the row decoder DR is selectively sent to 512 word lines, and supplied to the memory blocks B15 to B0.

In the memory block B15, the bit lines b0 to b7 are connected to a VSS power supply, that is, ground potential via discharge transistors TR0 to TR7, respectively. These discharge transistors TR0 to TR7 are set so as to turn on, when reset signals RST0 to RST7 from the reset circuit RS are supplied. The reset circuit RS receives three bits of address signals A4 to A6 and reset control signal RSTCNT to selectively output the reset signals RST0 to RST7.

Similarly, bit lines b8 to b15 are connected to the VSS power supply via discharge transistors TR8 to TR15. These discharge transistors TR8 to TR15 are connected with respect to the discharge transistors TR0 to TR7, respectively, so as to turn on by the reset signals RST0 to RST7. For example, the discharge transistors TR0, TR8 simultaneously turn on by the reset signal RST0. However, as described later, the bit line selector transistor selected by the second column decoder DC2 and the discharge transistor connected to the same bit line are constituted so as to mutually reverse on/off operations. For example, the bit line b0 is selected, when the selector transistor T400 turns on. In this case, the discharge transistor TR0 is controlled so as to turn off.

In the memory block B15, 16 bit lines in total connected to two selector transistors including the selector transistor T33 are also controlled to turn on/off by the reset signals RST0 to RST7 in the same manner as in the bit lines b0 to b15. Therefore, for example, when the reset signal RST0 is outputted, four discharge transistors in total including the discharge transistors TR0, TR8 are turned on, and the corresponding four bit lines are connected to a VSS potential.

Therefore, in all the memory blocks B15 to B0, when one reset signal, for example, the reset signal RST0 is outputted, four discharge transistors per memory block turn on. Therefore, 64 discharge transistors in total turn on.

As described above, since one reset signal from the reset generation circuit RS corresponding to one selection signal from the second column decoder DC2 turns off, the remaining seven reset signals in eight reset signals RST0 to RST7 turn on. Therefore, among 512 bit lines, all the bit lines excluding 64 bit lines are connected to the VSS potential.

However, as described above, among 64 bit lines connected to the discharge transistor which turns off, only 16 bit lines are precharged at the time of the read. This will be described later in detail.

The control signal CNT supplied to the row decoder DR is also supplied to the source line potential control circuit C2, and the control circuit C2 connects the common source line SL to the power supply VSS or ground node in response to the control signal CNT.

In this embodiment, 32 discharge transistors are used with respect to 32 bit lines b0 to b32 in the memory block B15, and the other memory blocks B14 to B0 are also similarly constituted.

Here, with reference to FIGS. 5 to 12, constitution examples of the control circuit C1, precharge control circuit CP, first column decoder DC1, second column decoder DC2, row decoder DR, reset circuit RS, source line potential control circuit C2, and sense circuit S shown in FIG. 4 will be described in detail. As described above, the respective circuits output predetermined signals, and these signals are inputted into the group of memory blocks B15 to B0. Here, as one example, the respective circuits will be associated with the memory block B15 and hereinafter described.

Figure 5:
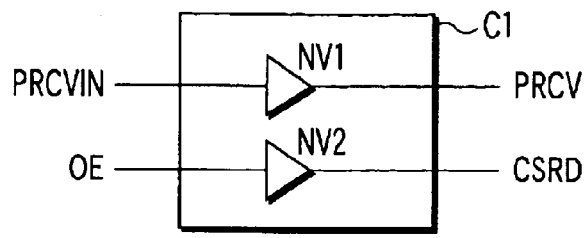
FIG. 5 is a block diagram showing a constitution example of a control circuit shown in FIG. 4.

The control circuit C1 shown in FIG. 5 includes buffers NV1 and NV2. Via the buffer NV1, the precharge control signal PRCVIN is outputted as the precharge signal PRCV inputted into the gate of the precharge transistor T1, the input terminal of the sense circuit S, and the row decoder DR.

Moreover, the system read control signal OE is outputted as the read instruction signal CSRD via the buffer NV2. The read instruction signal CSRD is inputted into the buffer circuit B for the data output in FIG. 4. That is, when the system read control signal OE has a HIGH level, a signal DBUS15 from an output terminal of the buffer circuit B of the data output is outputted to a system bus DBUS.

Figure 6:
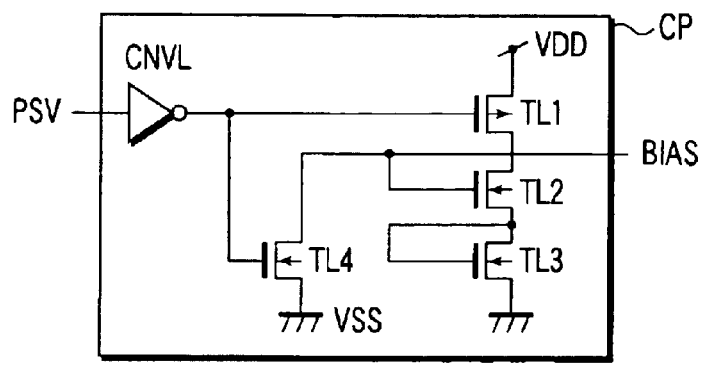
FIG. 6 is a block diagram showing a constitution example of a precharge control circuit shown in FIG. 4.

The bias generation circuit CP shown in FIG. 6 includes an inverter CNVL to which the power save signal PSV is supplied, and P-type transistor TL1 and N-type transistor TL4 to which the output signal of the inverter CNVL is supplied. Furthermore, between an output node via which the bias signal BIAS is outputted and the VSS power supply, two N-type transistors TL2, TL3 are connected in series in a state in which drains and gates are connected to each other. One end of the P-type transistor TL1 is connected to the VDD power supply, and the other end thereof is connected to the output node.

When the power save signal PSV in an H level state is inputted, the P-type transistor TL1 turns on and the N-type transistor TL4 turns off by the output of the inverter CNVL in an L level state. Accordingly, the bias signal BIAS is outputted from the output node, the transistor T2 of FIG. 4 turns on, and the voltage from the VDD power supply for the precharge is supplied to the selector transistors T30 to T33. When the power save signal PSV indicates L, the output node indicates L, the transistor T2 turns off, any precharge voltage is not supplied, and a power save mode is achieved.

Figure 7:
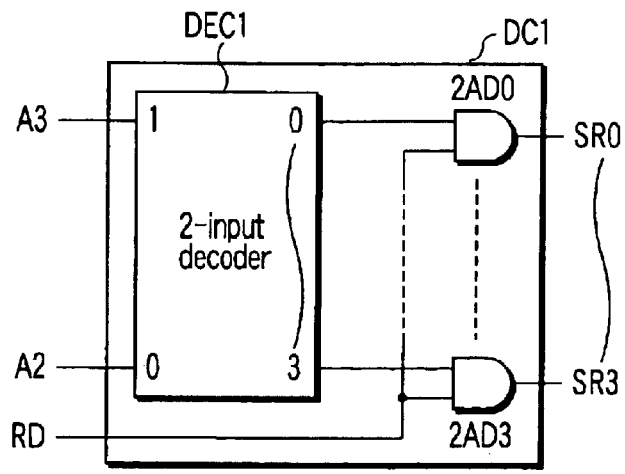
FIG. 7 is a block diagram showing a constitution example of a first column decoder shown in FIG. 4.

The first column decoder DC1 shown in FIG. 7 includes a 2-input decoder DEC1 and four AND circuits 2AD0 to 2AD3 which receive the output of this decoder DEC1. The 2-input decoder DEC1 decodes two bits of address signals A2, A3. The decoded signals and read control signal RD are supplied to the AND circuits 2AD0 to 2AD3. The selection signals SR0 to SR3 to be sent to the gates of the selector transistors T30 to T33 for the read are outputted via the output terminals of the AND circuits 2AD0 to 2AD3.

Figure 8:
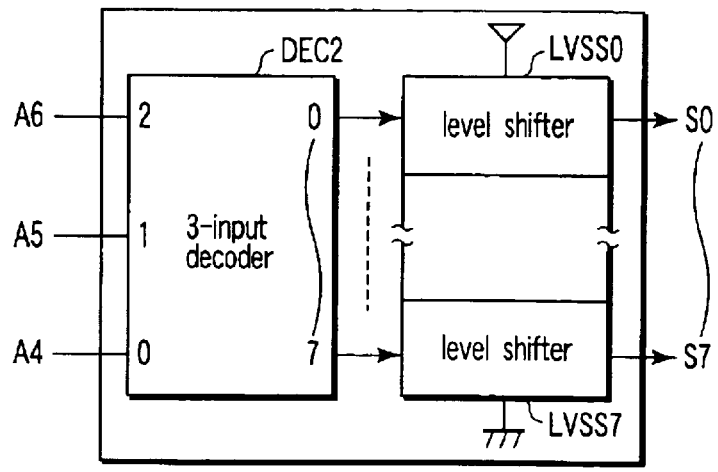
FIG. 8 is a block diagram showing a constitution example of a second column decoder shown in FIG. 4.

Furthermore, the second column decoder DC2 shown in FIG. 8 includes a 3-input decoder DEC2 and eight level shifters LVSS0 to LVSS7 which convert the levels of the output signals of the decoder DEC2.

When 3 bits of address signals A4 to A6 are inputted as the input signal into the second column decoder DC2, the signals are decoded by the 3-input decoder DEC2, and eight outputs appear at output terminals "0" to "7". The decoded address signals are inputted into the level shifters LVSS0 to LVSS7 as required. The level-shifted signals S0 to S7 are outputted as signals to be sent to the gates of 32 column selector transistors including column selector transistors T400 to T415 which select 32 bit lines including the bit lines b0 to b15 of FIG. 4.

Figure 9:
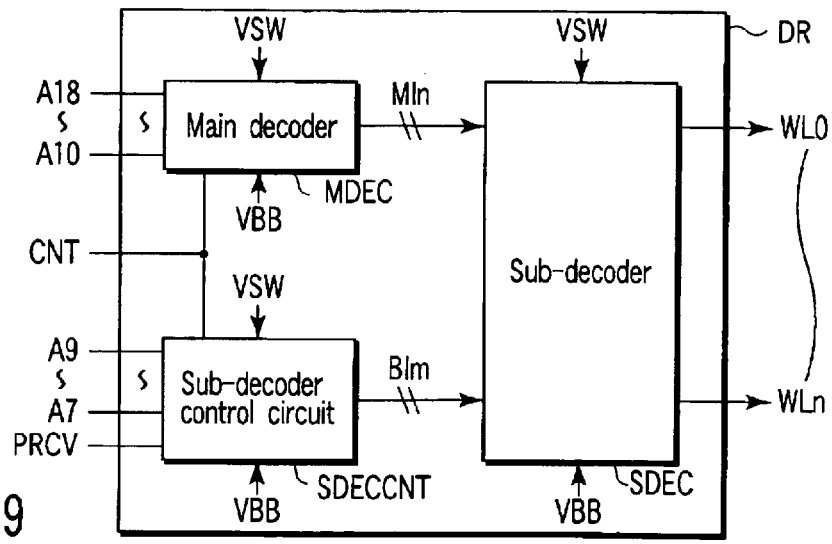
FIG. 9 is a block diagram showing a constitution example of a row decoder shown in FIG. 4.

Moreover, for example, as shown in FIG. 9, the row decoder DR includes a main decoder MDEC, sub-decoder SDEC, and sub-decoder control circuit SDECCNT. Nine bits of address signals A10 to A18 are supplied to the main decoder MDEC and decoded, and three bits of address signals A7 to A9 are decoded by the sub-decoder control circuit SDECCNT, respectively.

Furthermore, the precharge signal PRCV from the control circuit C1 is supplied to the sub-decoder control circuit SDECCNT, and further the control signal CNT is supplied in common to the main decoder MDEC and sub-decoder control circuit SDECCNT. The control signal CNT controls whether or not to output the signals from the main decoder MDEC and sub-decoder control circuit SDECCNT to the outside.

It is to be noted that a power voltage of a VSW level and that of a VBB level are supplied to the power terminals of the main decoder MDEC, sub-decoder SDEC, and sub-decoder control circuit SDECCNT. Here, the voltage of the VSW level has a level slightly higher than the VDD level.

The main decoder MDEC decodes n signals. For example, 512 decoded signals MIn are controlled by the control signal CNT and outputted to the sub-decoder SDEC.

Moreover, the address signals A7 to A9, the control signal CNT, and the precharge signal PRCV which is the output signal of the control circuit C1 are inputted into the sub-decoder control circuit SDECCNT, and m, for example, eight output signals BIm from the control circuit are decoded signals of the address signals A7 to A9. Output states of the signals are determined by the precharge signal PRCV and control signal CNT.

The output signals MIn of the main decoder MDEC and the output signals BIm of the sub-decoder control circuit SDECCNT are inputted into the sub-decoder SDEC, and word line selection signals WL0 to WLn are outputted. The word line selection signals WL0 to WLn are outputted as the same number n of signals as that of the decoded output signals MIn from the main decoder MDEC, for example, 512 signals from the sub-decoder SDEC. That is, the sub-decoder SDEC is a switch circuit which selects and outputs the input signal BIm by the select signal MIn.

The word line selection signals WL0 to WLn from the sub-decoder SDEC are inputted into the gate of the memory cell. In the example of FIG. 4, the word line selection signal WLn-1 is supplied to the gates of 32 memory cells including the memory cells CEL0 to CEL15 in the memory block B15, and the word line selection signal WLn is supplied to 32 memory cells including the memory cells CEL0X to CEL15X. In the memory cell array, the word line selection signal WLn-1 is supplied to 512 memory cells in all the memory blocks B15 to B0. The word line selection signal WLn is also supplied to 512 memory cells.

Figure 10:
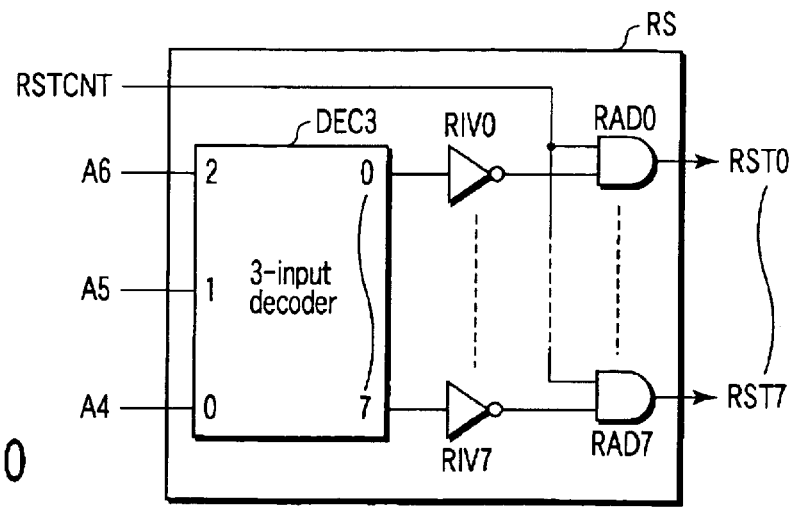
FIG. 10 is a block diagram showing a constitution example of a reset circuit shown in FIG. 4.

For example, as shown in FIG. 10, the reset circuit RS shown in FIG. 4 includes: a 3-input decoder DEC3 into which three bits of address signals A4 to A6 are inputted; inverters RIV0 to RIV7 which reverse eight decode outputs from the 3-input decoder DEC3; and AND circuits RAD0 to RAD7 for obtaining AND outputs of the outputs of the inverters RIV0 to RIV7 and reset control signal RSTCNT. By the inverters RIV0 to RIV7, the output reset signal from the reset generation circuit RS has a polarity reverse to that of the column selection signal of the second column decoder DC2.

That is, the decoded output signal from the 3-input decoder DEC3 is inputted into one input terminal of each of AND circuits RAD0 to RAD7 via the predetermined inverters RIV0 to RIV7, respectively. The reset control signal RSTCNT which is a discharge permission signal is inputted into the other input terminal of each of the AND circuits RAD0 to RAD7. The reset signals RST0 to RST7 outputted from the output terminals of the AND circuits RAD0 to RAD7 are outputted as the signals to be sent to the gates of 64 transistors among 512 discharge transistors including discharge transistors TR0 to TR15 of the bit lines.

Figure 11:
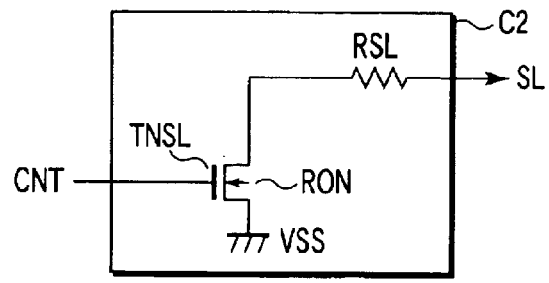
FIG. 11 is a block diagram showing a constitution example of the control circuit shown in FIG. 4.

As shown in FIG. 11, the control circuit C2 shown in FIG. 4 includes: an N channel transistor TNSL to whose gate the control signal CNT is supplied; and a resistance RSL. A source of the transistor TNSL is connected to the power supply VSS, and a drain is connected to the common source line SL of FIG. 4 via the resistance RSL.

In FIG. 11, when the control signal CNT has the H level, the N channel transistor TNSL turns on, and the common source line SL is connected to the ground node or the power supply VSS via the resistance RSL. Here, a channel section of the N channel transistor TNSL is formed so as to obtain a W/L ratio, for example, of 500/0.7, that is, to set W to be large to some degree. However, the W/L ratio is one example of such a W/L ratio that any trouble is not caused in bringing the common source line SL into the VSS level. In this embodiment, an amount of discharge current of the bit line flowing into the common source line SL is small. Therefore, the W/L ratio, that is, W does not have to have such a large value, and any value may also be used within a range of the condition.

Thus, the channel width W of the source line discharge transistor TNSL is not required to be large excessively. Further, since the parasitic resistance of the source line SL is not required to be decreased largely, it is not necessary to increase the source line width as well as the area of the contact size, thereby enabling to prevent the macro-size of the memory circuit apparatus from being increased.

In other words, according to the present embodiment, it is possible to decrease the size of the channel width of the source line discharge transistor TNSL and the size of the source line width, thereby enabling to decrease the macro-size of the memory circuit apparatus.

Further, according to the present embodiment, since it is possible to prevent charges on a bit line connected to a selected nonvolatile memory cell at the read mode from being remained, soft write operation to the floating gate of the selected nonvolatile memory cell caused by the remaining charges can also be prevented. Thus, when a selected memory cell is in an on-state, this on-state is not changed to an off state due to the soft write operation, thereby providing a memory circuit apparatus of high reliable.

Here, for example, a resistance value of the resistance RSL is set to 280 Ω, and a resistance RON of the N channel transistor TNSL at the time of on-state is set to 20 Ω. That is, a synthesized resistance of the resistance RSL and the on-resistance RON of the transistor TNSL is 300 Ω. However, the synthesized resistance value may be a certain resistance value to such an extent that the float of the potential of the source line by the discharge current flowing through the source line by the embodiment does not cause any read error, and does not have to be necessarily set to 300 Ω.

Figure 12:
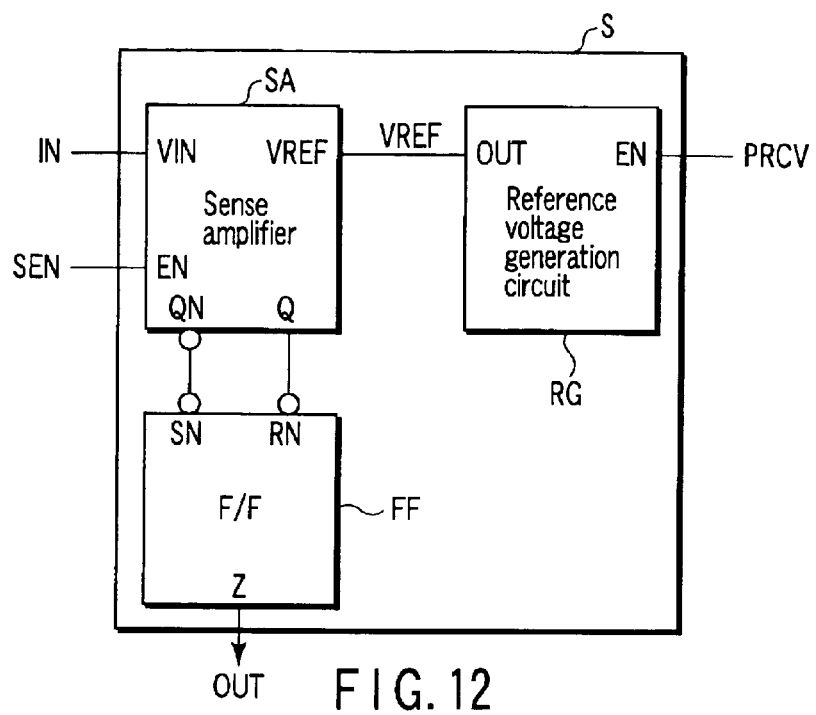
FIG. 12 is a block diagram showing a constitution example of a sense circuit shown in FIG. 4.

As shown in FIG. 12, the sense circuit S shown in FIG. 4 includes: a sense amplifier SA: a reference voltage generation circuit RG for supplying the reference voltage VREF to the sense amplifier SA; and a flip flop circuit FF to which the output signal of the sense amplifier SA is supplied.

Figure 13:
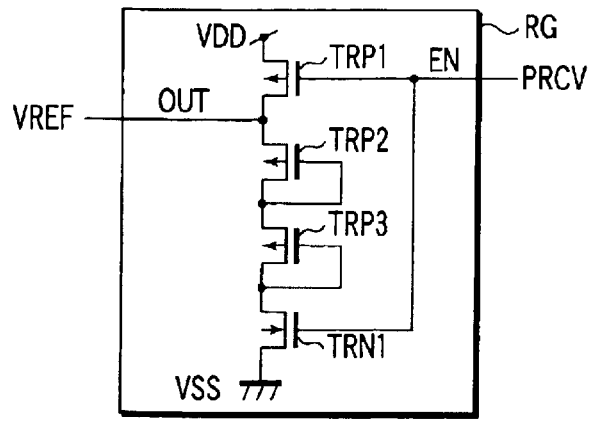
FIG. 13 is a block diagram showing a constitution example of a reference voltage generation circuit in the sense circuit shown in FIG. 12.

As shown in FIG. 13, the precharge signal PRCV which is the output signal of the control circuit C1 is inputted into an input terminal EN of the reference voltage generation circuit RG, and the reference voltage VREF is outputted via the output terminal OUT and supplied to the reference voltage terminal VREF of the sense amplifier SA.

In addition to the reference voltage terminal VREF, the sense amplifier SA includes input terminals VIN and EN. An input signal IN for data read from the bit line described later is inputted into the input terminal VIN of the sense amplifier SA. The sense enable signal SEN is inputted into the other input terminal EN. Output terminals QN and Q of the sense amplifier SA are connected to set and reset input terminals SN and RN of the flip flop circuit FF. The output signal OUT of the sense circuit S is outputted via an output terminal Z of the flip flop circuit FF. The output signal OUT is inputted into the buffer circuit B of the data output of FIG. 4.

Next, one example of the circuit arrangement of the reference voltage generation circuit RG, sense amplifier SA, and flip flop circuit FF constituting the sense circuit S will be described with reference to FIGS. 13 to 15.

The reference voltage generation circuit RG shown in FIG. 13 includes P channel transistors TRP1 to TRP3 and N channel transistor TRN1 connected to one another in series between the power supply terminals VDD and VSS. The precharge signal PRCV inputted into the input terminal EN of the reference voltage generation circuit RG is supplied to the gates of the transistors TRP1 and TRN1, and the reference voltage VREF is outputted to the output terminal OUT from the connection node of the transistors TRP1 and TRP2. That is, in the circuit of FIG. 13, when the precharge signal PRCV is off, that is, in the L level, the positive reference voltage VREF is outputted via the output terminal OUT and supplied to the sense amplifier SA.

Figure 14:
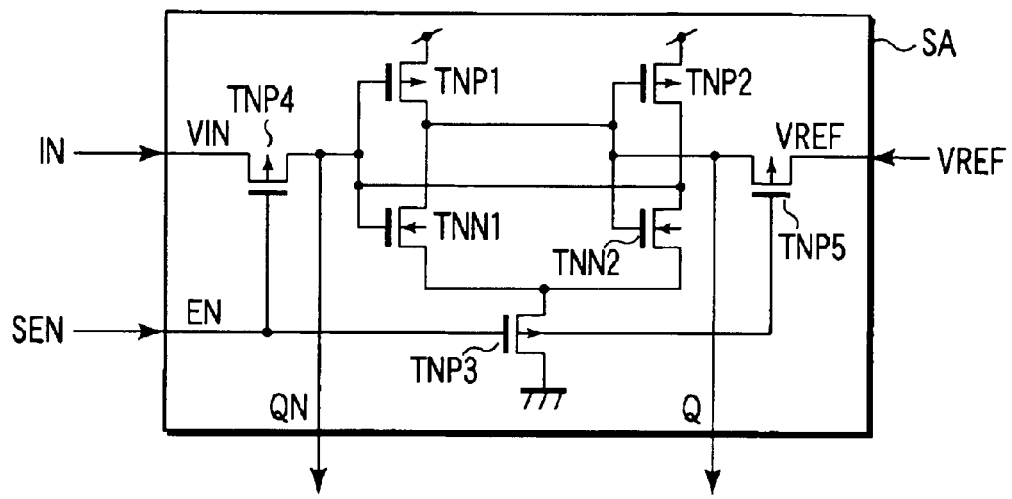
FIG. 14 is a block diagram showing a constitution example of a circuit of a sense amplifier in the sense circuit shown in FIG. 12.

As shown in FIG. 14, the sense amplifier SA includes P channel transistors TNP1 to TNP5 and N channel transistors TNN1, TNN2. The voltage VREF which is the output from the reference voltage generation circuit RG is inputted into the reference voltage input terminal VREF. The input signals IN and SEN are inputted into the input terminals VIN and EN of the sense amplifier SA, respectively.

In FIG. 14, the sense enable signal SEN is inputted into the gates of the P channel transistors TNP3 to TNP5 to control conduction/non-conduction of the signals IN and VREF similarly inputted on a source side of the P channel transistors TNP4, TNP5. That is, when the sense enable signal SEN has the L level, these transistors TNP3 to TNP5 are turned on. The power voltages VDD, VSS are supplied to the inverter constituted of the transistors TNP1, TNN1 and that constituted of the transistors TNP2, TNN2. These two inverters constitute a latch circuit.

When the transistor TNP5 turns on, the flip flop FF is reset by output Q from the sense amplifier SA, and the transistor TNP2 turns off and the transistor TNN2 turns on by the reference voltage VREF. Accordingly, the transistor TNP1 turns on and the transistor TNN1 turns off. Therefore, this state is latched by these transistors TNP1, TNP2, TNN1, TNN2.

For example, when the read signal IN having the H level from the memory cell is supplied to the input terminal VIN in this state, a QN signal having the H level is sent to the flip flop FF to achieve a set state. Moreover, the transistor TNP1 turns off, TNN1 turns on, TNN2 turns off, TNP2 turns on, and this state is latched. As a result, the signal OUT is supplied as the sense output from the sense circuit S to the output buffer circuit B of FIG. 4 from the flip flop circuit FF.

Figure 15:
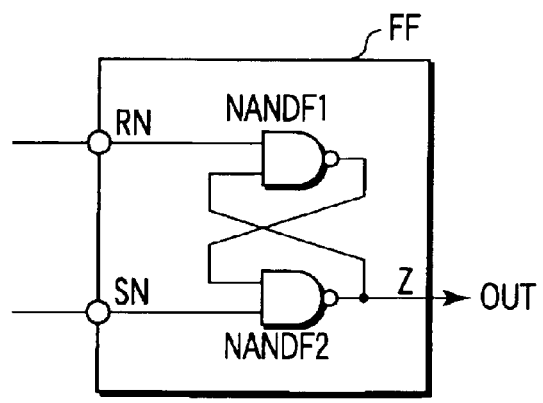
FIG. 15 is a block diagram showing a circuit constitution example of a flip flop in the sense circuit shown in FIG. 12.

It is to be noted that, as shown in FIG. 15, the flip flop circuit FF includes two NAND circuits NANDF1 and NANDF2. A reset input terminal RN is connected to one input terminal of the NAND circuit NANDF1, and a set input terminal SN is connected to one input terminal of the NAND circuit NANDF2. As shown, the output of the NAND circuit NANDF1 is supplied to the other input terminal of the NAND circuit NANDF2, and the output terminal of the NAND circuit NANDF2 is connected to an output terminal Z of the flip flop circuit FF and also to the other input terminal of the other NAND circuit NANDF1.

The output signal OUT from the output terminal Z is inputted into the input terminal of the data output buffer circuit B.

Next, the operation of the memory circuit apparatus of FIG. 4 will be described in detail with reference to time charts of FIGS. 16A to 16U. Here, it is assumed that the word line WLn-1 connected to the row decoder DR corresponds to a ROM address A0 and that all the 512 memory cells selected by the word line WLn-1 are off-cells ("0"). It is also assumed that the word line WLn corresponds to a ROM address B8 and that all the 512 memory cells selected by the word line WLn are on-cells ("1"). A read mode will hereinafter be described in a case where the read is performed in order of the ROM address A0→ROM address B8 on this condition.

That is, there are 512 memory cells in total having the ROM address A0 connected to the word line WLn-1 in the memory cell array, and all these memory cells are the off-cells. In the embodiment of the present invention shown in FIG. 4, only the selector transistor T30 turns on by an output SR0 of the first column decoder DC1 at the time of the ROM address A0 in the memory block B15, and only the column selector transistor T400 turns on by the output of the second column decoder DC2. Therefore, only the bit line b0 is an object of the precharge in the memory block B15, and only the memory cell CEL0 is an object of the read.

Similarly in the blocks B0 to B14, only the memory cell corresponding to the memory cell CEL0 connected to the bit line corresponding to the bit line b0 of the memory block B15 is the object of the read. That is, in the ROM address A0, one bit per memory block, that is, 16 bit lines connected to the off-cell for 16 bits are selected in 16 memory blocks.

On the other hand, it is assumed that all the 512 memory cells of the ROM address B8 connected to the word line WLn are the on-cells. In the same manner as in the off-cell selected by the word line WLn-1, at the time of the on-cell selection by the word line WLn, in this embodiment, the selector transistor T31 is selected by the first column decoder DC1 in the memory block B15 by the ROM address B8, and the transistor T408 is selected by the second column decoder DC2. Therefore, only the memory cell CEL8X connected to the bit line b8 is selected.

Similarly in the memory blocks B0 to B14, the memory cells connected to the bit lines corresponding to the bit line b8 are selected one by one. That is, only 16 bit lines are precharged for 16 bits connected to the selected memory cell having the on-cell state.

In this manner, the circuit operation will hereinafter be described with respect to the read of the memory cells all in the off-state→memory cells all in the on-state with reference to FIGS. 4 and 16A to 16U.

An operation for the read of the memory cell CEL0 having the off-cell state in the ROM address A0 will first be described. In this read mode, as shown in FIG. 16A, the reset control signal RSTCNT supplied to the reset generation circuit RS has the H level. In this state, one period between time t1 and t3 of the system clock CLK of FIG. 16B corresponds to a period of the read of the ROM address A0 designated by address signals A18 to A2 of FIG. 16C. In this period, the address signals A2 to A18 shown in FIG. 16C indicate a content required for the read of the memory cell CEL0.

In the read mode, as predetermined signals, together with the reset control signal RSTCNT of FIG. 16A, the read control signal RD shown in FIG. 16F is also constantly set to the signal of the H level.

First, the precharge control signal PRCVIN shown in FIG. 16D which is a reverse signal of the clock signal CLK is supplied to the control circuit C1 of FIG. 4. This precharge control signal PRCVIN is supplied as the precharge signal PRCV to the row decoder DR via the buffer NV1 of FIG. 5 and also inputted to the gate of the precharge transistor T1 at the L level. Therefore, the precharge transistor T1 is turned on in a period of time t1 to t2 in which the precharge signal PRCV indicates the L level, and the H level signal is supplied as the input IN of the sense circuit S. At this time, the system read control signal OE supplied to the control circuit C1 indicates the L level in the period of time t1 to t3 as shown in FIG. 16S. Therefore, the read instruction signal CSRD also indicates the L level as shown in FIG. 16T.

When the bias signal BIAS from the bias generation circuit CP is inputted into the gate of the transistor T2 at the H level in this state, the transistor T2 is turned on, and supplies the precharge voltage VDD to the selector transistors T30 to T33. At this time, as shown in FIG. 16H, the signal SR0 outputted from the first column decoder DC1 is inputted as the H level into the gate of the selector transistor T30 for the read, and the signals SR1 to SR3 are inputted as the L level into the gates of the selector transistors T31 to T33 for the read. Accordingly, only the selector transistor T30 for the read is brought into the turned on state.

On the other hand, as shown in FIG. 16G, the signal S0 outputted from the second column decoder DC2 is inputted as the H level into the gate of the column selector transistor T400, and the signals S1 to S7 are inputted as the L level into the gates of the column selector transistors T401 to T407. Accordingly, only the column selector transistor T400 is brought into the turned on state. As shown in FIGS. 16C, 16G, this column selection signal S0 indicates the H level for two periods of the system clock CLK for the time t1 to t5, that is, in a read period of both the ROM addresses A0, B8.

As described above, any of the precharge transistor T1, selection transistor T2, and selector transistors T30 and T400 for the read is brought into the turned on state. Accordingly, the precharge power supply VDD on the drain side of the precharge transistor T1 is connected to a desired bit line b0 via the transistors T1, T2, T30, and T400, and this bit line b0 is precharged at the VDD voltage. That is, the precharge period of the bit line of the read of the ROM address A0 corresponds to the time t1 to t2 or time t3 to t4 of the clock signal CLK indicating the H level as shown in FIG. 16B.

Here, in the memory block B15, as shown in FIG. 16K, the reset signal RST0 outputted from the reset generation circuit RS indicates the L level having the polarity reverse to that of the selection signal S0, and therefore four discharge transistors are off in the memory block B15 including bit line discharge transistors TR0, TR8 to which the reset signal RST0 is supplied. Therefore, there is not any change of the potential in the bit line connected to these discharge transistors, and the precharged potential is held as it is.

On the other hand, output signals RST1 to RST7 having the H level from the reset generation circuit RS are inputted into the gates of the bit line discharge transistors other than four discharge transistors including the bit line discharge transistors TR0, TR8. Therefore, all the discharge transistors to which the reset signals having the H level are supplied are turned on, and all the bit lines connected to these discharge transistors are fixed at the VSS potential.

This state is similar in 16 memory blocks B15 to B0. Therefore, by the H level period by the selection of the ROM address A0 in the word line WLn-1 in the time t2 to t3 in FIG. 16I, only 16 bit lines including the bit line b0 selected by the ROM address A0 are precharged. That is, all the 496 bit lines other than 16 bit lines are not precharged, or are fixed at the VSS level.

For example, in the memory block B15, 28 bit lines excluding four bit lines including the bit lines b0, b8 are fixed at the VSS level. Additionally, three bit lines other than the bit line b0 selected in the ROM address A0 are not precharged at the time of the ROM address A0. Therefore, there is not any trouble even without any discharge operation.

Thereafter, when the clock signal CLK changes to the L level from the H level at the time t2, as shown in FIG. 16I, the signal of the H level is inputted into 32 memory cells including the memory cells CEL0 to CEL15 from the word line WLn-1.

Here, since the memory cell CEL0 connected to the bit line b0 precharged in the memory block B15 has the off-state, and the discharge transistor TR0 also has the off-state, the bit line b0 is held at the H level in the precharged VDD level. At this time, all the selector transistors T401 to T407 of the bit lines b1 to b7 connected to the selector transistor T30 have the off-state. Therefore, there is no fluctuation in the H level inputted into the input terminal VIN of the sense circuit S.

When the sense enable signal SEN shown in FIG. 16E is similarly inputted into the input terminal EN of the sense circuit S in this state, and only when the sense enable signal SEN indicates the H level, the sense circuit S takes in the read signal IN shown in FIG. 16P, and outputs the reverse signal OUT of the signal IN toward the buffer circuit B from the output terminal Z. That is, in the period of t2 to t3 in which the clock signal CLK indicates the L level, the data of the memory cell read by the selection signal passed through the word line WLn-1 is verified by the reversing of the precharge control signal PRCVIN (i.e., precharge signal PRCV), and the data is sensed in a timing adjusted to that of the sense enable signal SEN. It is to be noted that as shown in FIG. 16Q, the reference voltage signal VREF is produced inside the sense circuit S. However, this signal has a complementary relation with the signal PRCV to be inputted into the sense circuit S as described with reference to FIG. 13.

In this manner, the L level signal OUT outputted from the sense circuit S shown in FIG. 16R is outputted to the system bus DBUS15 via the buffer circuit B of the data output. However, it is controlled and determined by the read instruction signal CSRD shown in FIG. 16T whether or not the signal is to be outputted to the system bus DBUS15. That is, under the control of the read instruction signal CSRD, the signal from the buffer circuit B of the data output is outputted as the read data of the memory cell to the system bus DBUS15. The signal DBUS15 flowing through the system bus DBUS15 in the read of the ROM address A0 shown in FIG. 16U indicates the L level at the time t1 to t3. This is because the H level of the bit line b0 held by the memory cell CEL0 having the off-state is reversed by the sense circuit S, and outputted to the system bus DBUS15.

Here, as shown in FIG. 4, the system buses DBUS0 to DBUS15 are connected to a data bus DBUS, but in actual there are 16 DBUS, and the system buses DBUS0 to DBUS15 are connected to 16 different data buses DBUS.

Next, the operation for the read of the memory cell CEL8X selected by the ROM address B8 in the on-cell state will be described. This read operation is performed over the time period t3 to t5 of the clock CLK of FIG. 16B. In the period of t3 to t5 for the read of the ROM address B8, the address signals A2 to A18 shown in FIG. 16C indicates an address content for the read of the memory cell CEL8X. The read of the ROM address B8 is performed in the same manner as in the read of the ROM address A0.

First, the operation of the circuit in the period of t3 to t4 when the clock signal CLK indicates the H level will be described in the read period of t3 to t5 of the ROM address B8.

In the period of t3 to t4, in the same manner as in the period of t1 to t2, the precharge transistor T1 and bias transistor T2 are brought into the turned on state. As shown in FIG. 16H, the signal SR1 outputted from the first column decoder DC1 is applied as the H level into the gate of the selector transistor T31 for the read, and the signals SR0, SR2, and SR3 are applied as the L level into the gates of the selector transistors for the read T30, T32, and T33. Accordingly, only the selector transistor for the read T31 is brought into the turned on state.

At this time, as shown in FIG. 16G, following the period of t1 to t3, the signal S0 outputted from the second column decoder DC2 is applied as the H level into the gate of the column selector transistor T408, and the signals S1 to S7 are applied as the L level into the gates of the column selector transistors T409 to T415. Therefore, only the column selector transistor T408 has the turned on state.

As described above, the precharge transistor T1, the bias transistor T2, the selector transistor for the read T31, and the column selector transistor T408 selectively have the turned on state. Accordingly, the precharge power supply VDD on the drain side of the precharge transistor T1 turns on the transistors T1, T2, T31, and T408. Then, only the bit line b8 connected to the transistor T408 is precharged.

FIGS. 16L, 16M show the level state of the bit line b8 and that of those other than the bit line b8. In this manner, the bit line b8 is precharged at the H level in the period of t3 to t4 at the H level of the clock signal CLK in the memory block B15. Similarly, although not shown, the bit lines in the corresponding positions in the remaining 15 memory blocks B14 to B0 are also simultaneously precharged.

On the other hand, the output signals RST1 to RST7 in the H level of the reset generation circuit RS are supplied to the gates of the bit line discharge transistors other than four discharge transistors including the bit line discharge transistors TR0, TR8 in the memory block B15. Therefore, all the discharge transistors to which the reset signals in the H level are supplied are turned on, and all the bit lines connected to the discharge transistors are fixed at the VSS potential.

This state also applies to 16 memory blocks B15 to B0, and therefore only 16 bit lines including the bit line b8 selected by the ROM address B8 are precharged by the H level period of t3 to t4 of the clock CLK by the selection of the ROM address B8 in the word line WLn in FIG. 16J. That is, all the 496 bit lines other than the 16 bit lines are maintained in a non-precharged state, or fixed at the VSS level.

That is, at the time of the on-cell read in the ROM address B8, in the selected state of the ROM address B8, the 496 bit lines other than the 16 precharged bit lines including the bit line b8 indicate a non-precharged low level or a fixed VSS level, and only 16 bit lines of the ROM address B8 are precharged in the H level period of the clock signal CLK.

Thereafter, when the clock signal CLK shown in FIG. 16B changes to the L level from the H level at the time of t4, the signal of the H level is inputted into 32 memory cells including the memory cells CEL0X to CEL15X from the word line WLn. Here, the memory cell CEL8X connected to the precharged bit line b8 has the on-state. Therefore, the precharged electric charge of the bit line b8 is discharged, and drops from the H level of the VDD level to the grounded level or the VSS level of the common source line SL connected via the memory cell CEL8X to obtain the L level.

The drop of the bit line potential to the common source line SL level simultaneously occurs in the 16 selected bit lines. That is, when the clock signal CLK changes to the L level from the H level at the time of the read of the ROM address B8, the discharge currents for 16 bit lines in total including the precharged bit line b8 in the memory blocks B0 to B15 flow through the common source line SL. As a result, as shown in FIGS. 16N and 16O, a micro increase of a source line current and float phenomenon of the level occur at the time t4 in the common source line SL. That is, the discharge currents flow through the common source line SL from 16 bit lines via the memory cells in the on-state. However, since the current flows only from a small number of, that is, 16 bit lines, the level float of the common source line SL at the VSS level is micro.

In this manner, by the switching by the on-cells such as the memory cell CEL8X in the L level period (t4 to t5) of the clock signal CLK, 16 bit lines including the precharged bit line b8 are discharged. For example, when the current flowing through the common source line SL by the on-cell is 50 μA, a total on-cell current flowing through the common source line SL from 16 bit lines indicates a current value of 0.8 mA. As described above, the level float of the common source line SL held at the VSS level is momentary and micro. This eliminates a garble defect of the on-cell read data "1" to "0" by the level float of the common source line SL at the time of the mode of the read of all the cells connected to the word line WLn-1 being the off-cells→the read of all the cells connected to the word line WLn being the on-cells.

In the memory block B15, the bit line b8 is discharged to have the L level, and the signal of the L level is then inputted into the input terminal VIN of the sense circuit S. At this time, when the sense enable signal SEN shown in FIG. 16E is inputted into the input terminal EN of the sense circuit S, and only when the sense enable signal SEN indicates the H level, the sense circuit S takes in the signal IN shown in FIG. 16P, and outputs the reversed signal OUT of the amplified signal IN via the output terminal Z as shown in FIG. 16R.

That is, when the clock signal CLK indicates the L level (t4 to t5), the read data of the memory cell obtained by supplying a signal to the word line WLn is verified, and the data is sensed in response to the sense enable signal SEN.

In this manner, the signal OUT outputted from the sense circuit S shown in FIG. 16R is outputted to the system bus DBUS15 via the buffer circuit B of the data output controlled by the read instruction signal CSRD. Therefore, in the period when the system read control signal OE shown in FIG. 16S indicates the L level, the read data of the memory cell is outputted to the system bus DBUS15.

The signal DBUS15 flowing through the system bus DBUS15 in the read of the ROM address B8 shown in FIG. 16U indicates the H level. This is because, the L level of the bit line b8 set to the VSS level by the memory cell CEL8X in the on-state is reversed by the sense circuit S, and outputted to the system bus DBUS15.

As described above, the bit line other than the bit line which is the read object is controlled to have the VSS level by the reset generation circuit RS. Accordingly, the maximum number of bit lines to be discharged at the time of the read of the whole memory cell array of 512×512 is set to 16, the amount of discharge current flowing through the common source line SL is minimized, and erroneous data read due to the potential float phenomenon on the common source line SL can be prevented.

Further, it is to be noted that, as described above, the bit lines disposed adjacent to the selected bit line are fixed at the VSS level. Therefore, even after the precharge transistor is turned off, the level drop of dynamic data "1" of the precharged bit line due to capacity coupling between the adjacent bit lines can be prevented. Therefore, the garble defect of the off-cell read data "0" to "1" can be eliminated.

Figure 17:
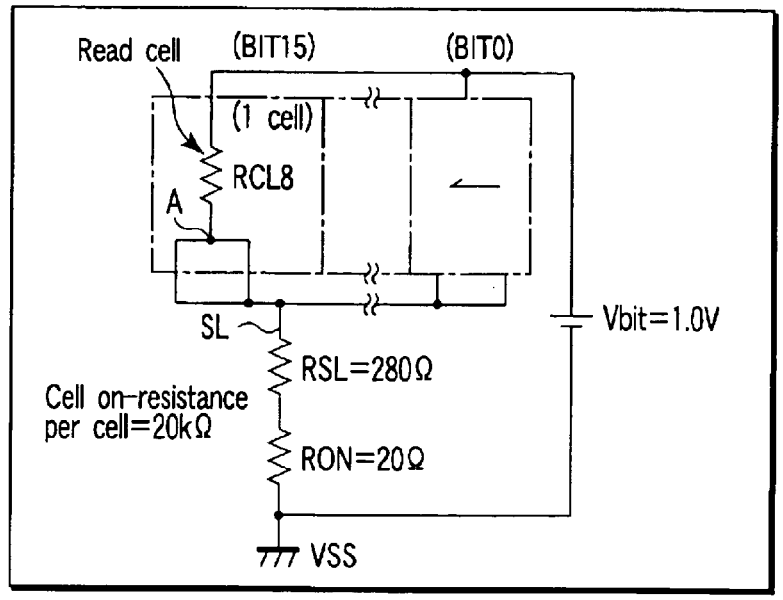
FIG. 17 is an equivalent circuit diagram at the time of the read of memory cells all in an on-state after 16 bit lines are precharged in the embodiment of FIG. 4.

FIG. 17 shows an equivalent circuit at the time of the read of the circuit extending to the common source line SL from the memory cells in a case where all the 16 precharged bit lines as the read object are connected to the memory cells having the on-cell state as in the ROM address B8. In FIG. 17, reference symbols BIT0 to BIT15 denote the bit lines connected to the selected memory cells having the on-cell state in the memory blocks B0 to B15. A resistance RCL8 indicates a parasitic resistance of one selected memory cell at the time of the read.

A calculation example of the potential at the time of the level float in a node A between the common source line SL fixed at the VSS level and the memory cell in FIG. 17 is as follows.

Precharge potential Vbit of each bit line=1.0 V

Synthesized resistance value RCLall of 16 on-cells=1250 Ω

Parasitic resistance RSLA from point A to the node VSS via the common source line SL=300 Ω

Potential of point A=(RSLA/(RCLall+RSLA))* Vbit= 0.19 V

In this manner, in the embodiment of the present invention, since the value of the discharge current flowing through the common source line SL at the data read is small, it is not necessary to excessively increase a channel width W of the N channel transistor TNSL for the discharge of the common source line SL in the control circuit C2 shown in FIG. 11, as noted before. Moreover, the layout between the common source line SL and VSS can easily be designed.

In the first embodiment shown in FIG. 4, an example in which the nonvolatile memory cell connected to the word line of the row decoder DR is formed by $E^2PROM$ has been described. Furthermore, this memory cell may also be formed, for example, of NOR type mask ROM (MROM). It is to be noted that by this constitution, the circuit corresponding to the control circuit C2 is grounded beforehand at the VSS level, and the common source line SL can constantly be set to VSS level.

Figure 18:
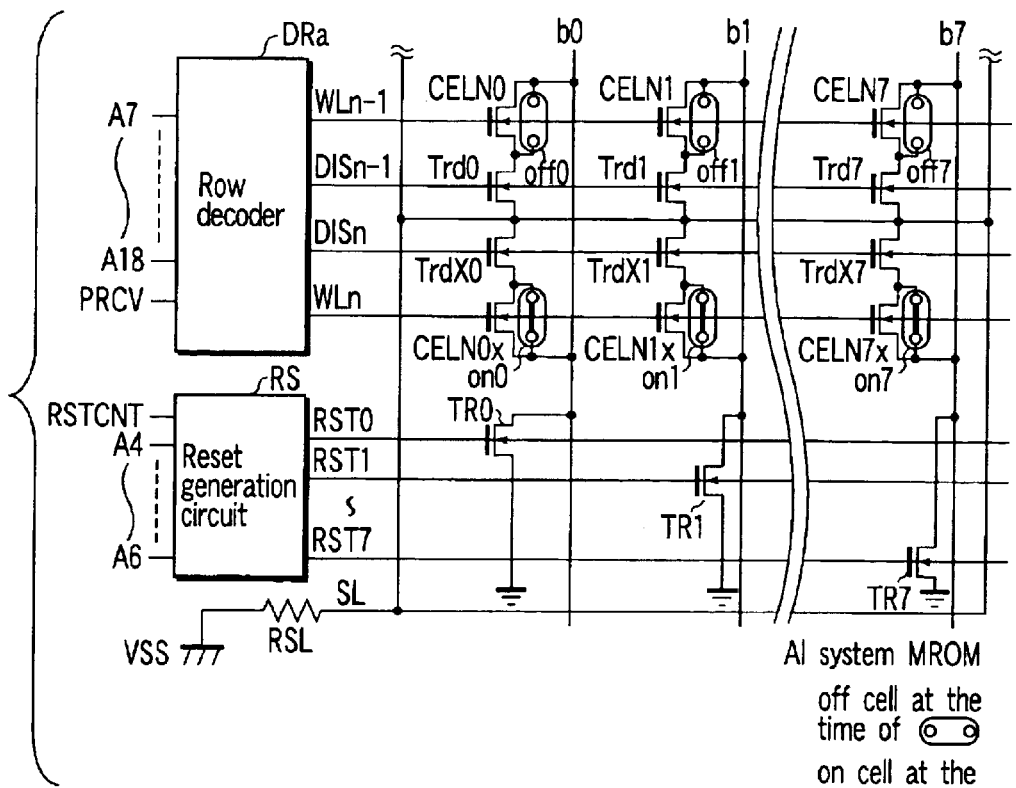
FIG. 18 is a block diagram showing a circuit constitution of a part of the memory circuit apparatus including an NOR type memory cell according to another embodiment of the present invention.

FIG. 18 shows a second embodiment of the present invention in which the memory cell connected to the word line of a row decoder DRa is constituted of MROM of Al system of NOR type. It is to be noted that in FIG. 18 the same components as those of the first embodiment shown in FIG. 4 are omitted or are denoted with the same reference symbols and the detailed description thereof is omitted.

In FIG. 18, the row decoder DRa is constituted instead of the row decoder DR of FIG. 4. Different from the embodiment of FIG. 4, the control signal CNT is not supplied to the row decoder DRa. The common source line SL is grounded of the VSS level via the resistance RSL acting as the control circuit C2 shown in FIG. 4.

Instead of the off-cells CEL0 to CEL7 of FIG. 4, in the embodiment of FIG. 18, memory cells CELN0 to CELN7 are used in combination with selector transistors Trd0 to Trd7. Here, any of the memory cells CELN0 to CELN7 is formed of an NMOS transistor. There is no short circuit between the source and drain by aluminum (Al), and an off-cell configuration is achieved. These memory cells CELN0 to CELN7 are connected in series to the selector transistors Trd0 to Trd7 between the corresponding bit lines b0 to b7 and the common source line SL. Additionally, in actual, in the whole memory cell array, for example, 512 memory cells have the same off-cell constitution.

Moreover, instead of the on-cells CEL0X to CEL07X of FIG. 4, in FIG. 18, memory cells CELN0X to CELN7X are used in combination with selector transistors TrdX0 to TrdX7. Here, any of the memory cells CELN0X to CELN7X is constituted of the NMOS transistor. There is a short circuit between the source and drain by aluminum (Al) as shown by a bold black line in FIG. 18, and an on-cell constitution is achieved. The memory cells CELN0X to CELN7X are connected in series to the selector transistors TrdX0 to TrdX7 between the corresponding bit lines b0 to b7 and the common source line SL. In actual, in the whole memory cell array, for example, 512 memory cells are assumed to have the same on-cell constitution.

In this manner, a combined circuit of the memory cells CELN0X to CELN7X with the selector transistors TrdX0 to TrdX7 is connected in parallel with the combined circuit of the other memory cells CELN0 to CELN7 with the selector transistors Trd0 to Trd7 with respect to the common source line SL, and the NOR type memory cell constitution is achieved.

Moreover, the word line WLn-1 connected to the row decoder DRa, a block selection line Disn-1, a block selection line Disn, and the word line WLn are connected to gate portions of the NOR type memory cells CELN0 to CELN7, selector transistors Trd0 to Trd7, selector transistors TrdX0 to TrdX7, and NOR type memory cells CELNX0 to CELNX7.

It is to be noted that for the NOR type memory cells CELN0 to CELN7 connected to the word line WLn-1, in FIG. 18, open terminals Off0 to Off7 indicate an off-state between the source and drain. However, in actual, the terminals Off0 to Off7 are not formed, and aluminum wiring is not disposed between the terminals. That is, it is schematically indicated that there is a turned off state even when the signal of the H level is inputted into the respective gates of the NOR type memory cells CELN0 to CELN7.

Similarly, this also applies to the other NOR type memory cells CELN0x to CELN7x. In actual, terminals ON0 to ON7 are not formed, and the aluminum wiring is formed between the source and drain. That is, it is schematically indicated that there is the turned on state between the source and drain, even when the signal of the H level is not supplied to any gate of the NOR type memory cells CELNX0 to CELN7X.

Figure 19:
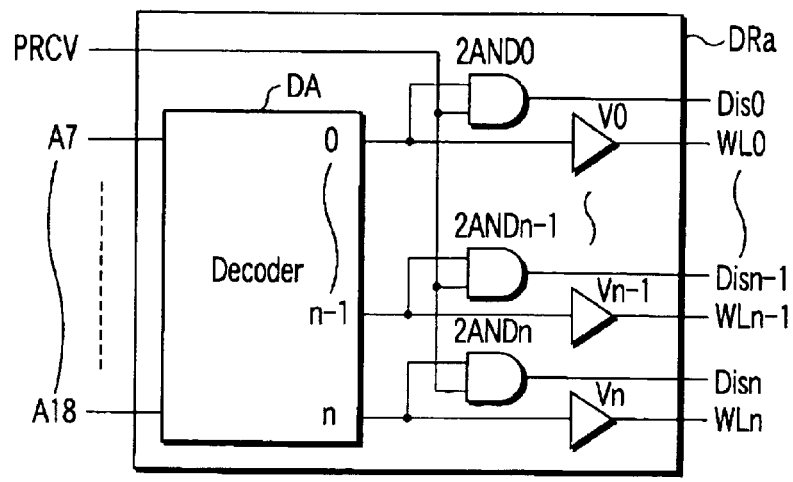
FIG. 19 is a block diagram showing a circuit constitution example of the row decoder shown in FIG. 18.

Here, an inner constitution of the row decoder DRa of FIG. 18 is shown in FIG. 19. The row decoder DRa shown in FIG. 19 includes a decoder DA to which the address signals A7 to A18 are supplied; 2-input AND circuits 2AND0 to 2ANDn to which n+1 outputs from the decoder DA are supplied together with the precharge signal PRCV; and buffers V0 to Vn.

The address signals A7 to A18 are decoded by the decoder DA to produce a designation signal of a row address to be supplied to the word line. The decoded signal is inputted into one input terminal of each of the 2-input AND circuits 2AND0 to 2ANDn, and the input terminals of the buffers V0 to Vn. The precharge signal PRCV which is the output signal from the control circuit C1 of FIG. 4 is inputted into the other input terminal of each of the 2-input AND circuits 2AND0 to 2ANDn in the row decoder DRa.

The signals outputted from output terminals of the 2-input AND circuits 2AND0 to 2ANDn are supplied to the selection lines Dis0 to Disn. The signals outputted from the output terminals of the buffers V0 to Vn are supplied to the word lines WL0 to WLn. In the same manner as in FIG. 4, the bit lines b0 to b7 are constituted to be connected to the power supply VSS via the discharge transistors TR0 to TR7 controlled by the output signal of the reset generation circuit RS.

Here, the operation of the memory circuit apparatus of the embodiment shown in FIG. 18 will hereinafter be described with respect to the operation for the read in order of memory cell CELN0→memory cell CELN1X. It is to be noted that the circuit part not shown in FIG. 18 is the same as that in FIG. 4. Therefore, the operation will be described also with reference to FIG. 4.

First, the bit line b0 is precharged by the precharge power supply (not shown) constituted in the same manner as in FIG. 4, when the clock signal CLK indicates the H level in the period of t1 to t2 in FIG. 16B.

When the clock signal CLK, that is, the precharge signal PRCV changes to the L level at time t2 in this state, the signal flowing through the selection line Disn connected to the row decoder DRa, the signal flowing through the word line WLn, and the output signal RST0 from the reset generation circuit RS indicate the L level. The signal flowing through the word line WLn-1, the signal flowing through the selection line Disn-1, and the signals RST1 to RST7 indicate the H level.

Then, the turned on state is achieved between the source and drain of the selector transistor Trd0, and the data is read from the NOR type memory cell CELN0. However, the NOR type memory cell CELN0 has the off-state. Moreover, the bit line discharge transistor TR0 also has the off-state. Therefore, the signal of the bit line b0 held at the H level is inputted into the sense circuit S.

It is to be noted that when the clock signal CLK indicates the L level at the time of the read of the NOR type memory cell CELN0, the other bit lines b1 to b7 are fixed at the VSS level via the bit line discharge transistors TR1 to TR7.

Next, the operation for the read of the memory cell CELN1X will be described. First, when the clock signal CLK changes to the H level from the L level, for example, at the time t3, the bit line b1 is precharged. When the clock signal CLK changes to the L level at time t4 in this state, the signal flowing through the word line WLn-1, the signal flowing through the selection line Disn-1, and the signal RST1 indicate the L level, and the signal flowing through the selection line Disn, the signal flowing through the word line WLn, and the signals RST0 and RST2 to RST 7 indicate the H level.

Then, the selector transistor TrdX1 achieves the turned on state between the source and drain, and stored content of the NOR type memory cell CELN1x is read. The NOR type memory cell CELN1x has the on-state, the bit line discharge transistor TR1 has the off-state, and therefore the potential of the bit line b1 precharged at the H level is transmitted to the source line via the NOR type memory cell CELN1x and selector transistor TrdX1. As a result, the level of the bit line b1 is lowered and changed to the VSS level. Therefore, the signal indicating the L level of the bit line b1 is inputted into the sense circuit S. When the clock signal CLK indicates the L level, for example, at time t4 to t5 at the time of the read of the NOR type memory cell CELN1x, the bit lines b0, b2 to b7 are fixed at the VSS level via the bit line discharge transistors TR0, TR2 to TR7.

In the above-described circuit operation, the parasitic resistance also exists at the time of the read of the NOR type memory cell CELN1x. However, since the number of precharged bit lines is only 16, the synthesized resistance of the parasitic resistances of 16 NOR type memory cells is micro as compared with the resistance RSL. Therefore, since the discharged currents flow through the common source line SL only from 16 bit lines, needless to say, the level float of the common source line SL at the VSS level is micro.

Figure 20:
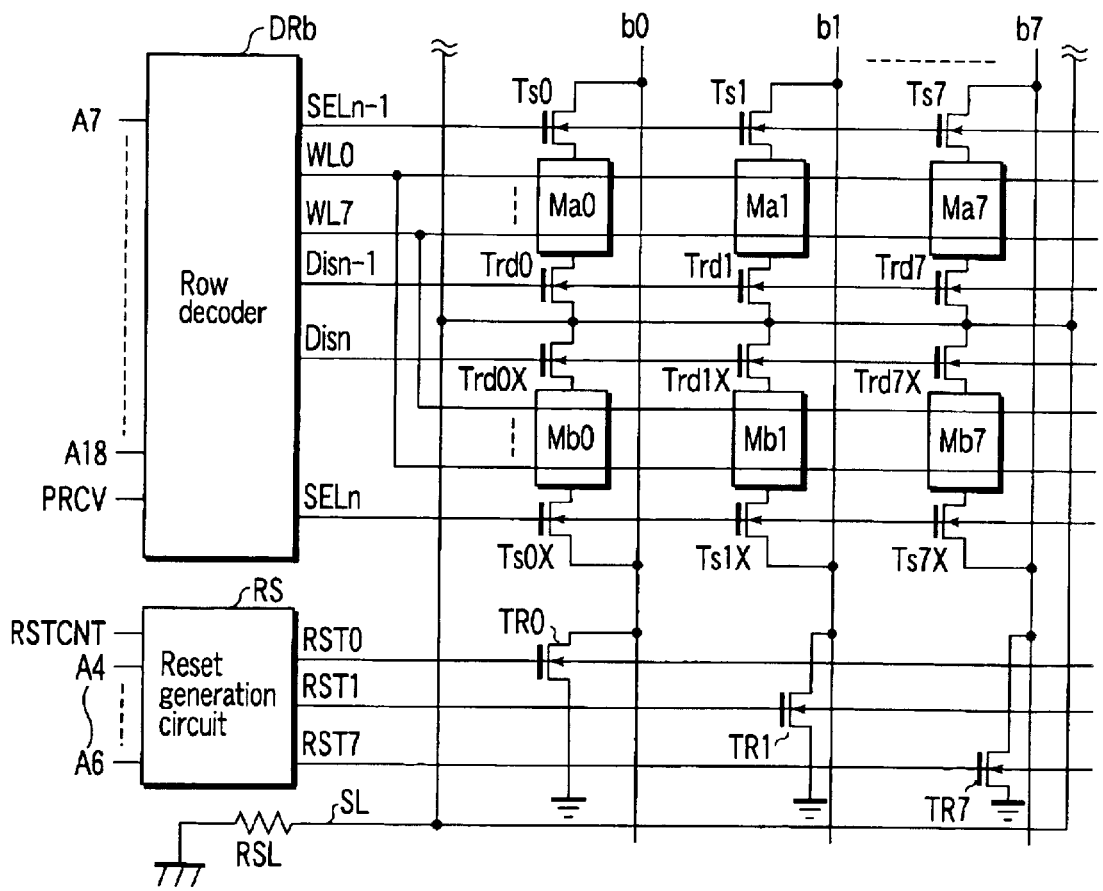
FIG. 20 is a block diagram showing a circuit constitution of a part of the memory circuit apparatus including a NAND type memory cell according to another embodiment of the present invention.

Moreover, in the second embodiment, the memory cell connected to the word line is constituted of the NOR type MROM, but may also be formed by a NAND type MROM. FIG. 20 is a circuit diagram showing a part of the memory circuit apparatus of an embodiment showing one example. It is to be noted that in FIG. 20, the same part as that of the first and second embodiments is omitted, or denoted with the same reference symbols and the detailed description is omitted.

First in FIG. 20, instead of the row decoder DRa of FIG. 18, a row decoder DRb is used. Moreover, the constitution of the control circuit C2 connected to the common source line SL of FIG. 4 changes to a constitution in which the common source line SL is grounded at the VSS level via the resistance RSL in the same manner as in the second embodiment.

Moreover, a selector transistor Ts0, NAND type memory cell Ma0, and selector transistor Trd0 are connected, for example, between the bit line b0 and the common source line SL. In parallel with these, a selector transistor Ts0X, NAND type memory cell Mb0, and selector transistor Trd0X are connected.

Similarly, selector transistors Ts1 to Ts7, NAND type memory cells Ma1 to Ma7, and selector transistors Trd1 to Trd7 are also connected between the respective bit lines b1 to b7 and the common source line SL. In parallel with these, selector transistors Ts1X to Ts7X, NAND type memory cells Mb1 to Mb7, and selector transistors Trd1X to Trd7X are connected. This also applies to the whole memory cell array.

Figure 21A:
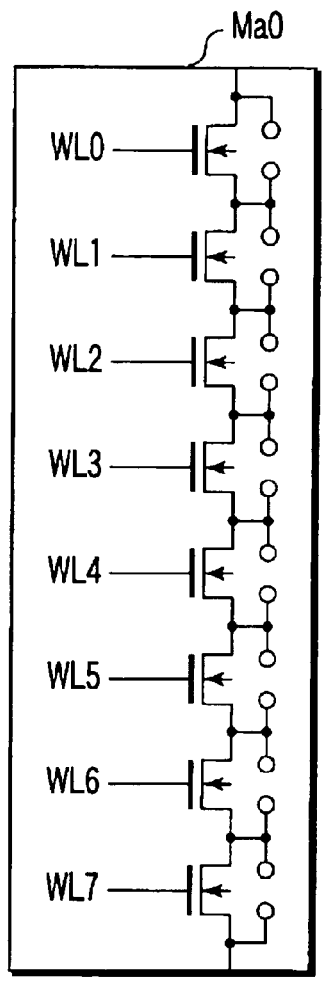
FIGS. 21A, 21B are circuit diagrams showing a constitution of the NAND type memory cell shown in FIG. 20.
Figure 21B:
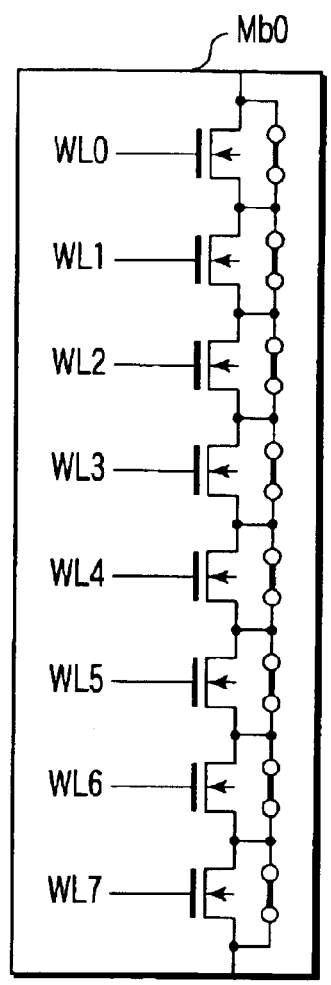

Here, as typical cases, the NAND type memory cell Ma0 is shown in FIG. 21A, and the NAND type memory cell Mb0 is shown in FIG. 21B. As shown in FIGS. 21A, 21B, the NAND type memory cells Ma0, Mb0 include a constitution in which eight memory cell transistors are connected in series, and cell selection signals from the word lines WL0 to WL7 are supplied to the respective gate portions of the memory cell transistors in this connection.

Each memory cell transistor shown in FIG. 21A has a turned off state between the source and drain, so that the output indicates the off-state, when the signal of the H level is inputted into the gate portion of the memory cell transistor. Moreover, for each memory cell transistor shown in FIG. 21B, when the signal of the H level is inputted into the gate portion of the memory cell transistor, the output indicates the on-state, and the turned on state is obtained between the source and drain.

That is, each memory cell transistor shown in FIG. 21A schematically indicates that the turned off state is achieved between the source and drain even with the input of the signal of the H level into each gate. Similarly, each memory cell transistor shown in FIG. 21B schematically indicates that the turned on state is achieved between the source and drain with the input of the signal of the H level into each gate.

Moreover, the respective gate portions of the selector transistors Ts0 to Ts7, NAND type memory cells Ma0 to Ma7, selector transistors Trd0 to Trd7, selector transistors Trd0X to Trd7X, NAND type memory cells Mb0 to Mb7, and selector transistors Ts0X to Ts7X are connected to a selection line SELn-1, word lines WL0 to WL7, selection line Disn-1, selection line Disn, word lines WL0 to WL7, and selection line SELn.

Here, an inner constitution of the row decoder DRb is shown in FIG. 22. The row decoder DRb shown in FIG. 22 includes a decoder DB, inverters IV0 to IV7, a decoder DC, 2-input AND circuits 2AND0x to 2ANDnx, and buffer circuits B0 to Bn.

The address signals A7 to A9 are decoded by the decoder DB, and inputted into the respective input terminals of the inverters IV0 to IV7. The respective output terminals of the inverters IV0 to IV7 are connected to the word lines WL0 to WL7.

The address signals A10 to A18 are decoded by the decoder DC. The decoded signals are inputted into one input terminal of each of the 2-input AND circuits 2AND0x to 2ANDnx, and the input terminals of the buffers B0 to Bn. The precharge signal PRCV which is the output signal from the control circuit C1 of FIG. 4 is inputted into the other input terminal of each of the 2-input AND circuits 2AND0x to 2ANDnx in the row decoder DRb. The signals outputted from the output terminals of the 2-input AND circuits 2AND0x to 2ANDnx are connected to the selection lines Dis0 to Disn. The signals outputted from the output terminals of the buffer circuits B0 to Bn are connected to selection lines SEL0 to SELn.

In a circuit shown in FIG. 20, an operation for the read in order of NAND type memory cell group Ma0 to Ma7→NAND type memory cell group Mb0 to Mb7 will hereinafter be described.

First, the bit line b0 is precharged by the precharge power supply VDD, when the clock signal CLK indicates the H level in the period of t1 to t2 in the same manner as in FIG. 4. When the clock signal CLK changes to the L level at t2 in this state, the signal flowing through the selection line Disn, the signal flowing through the selection line SELn, and the signal RST0 indicate the L level.

On the other hand, the signal flowing through the selection line SELn-1, the signal flowing through the word lines WL0 to WL7, the signal flowing through the selection line. Disn-1, and the signals RST1 to RST7 indicate the H level.

Then, the turned on state is achieved between the source and drain of the selector transistors Ts0 and Trd0, and the data is read from the NAND type memory cell Ma0. However, as described above, the NAND type memory cell Ma0 has the off-state, the bit line discharge transistor TR0 also has the off-state, and therefore the signal of the H level of the bit line b0 held at the H level is inputted into the sense circuit S of FIG. 4.

Moreover, when the clock signal CLK at the time of the read of the NAND type memory cell Ma0 indicates the L level, the bit lines b1 to b7 are fixed at the VSS level via the bit line discharge transistors TR1 to TR7.

Next, the operation during the read of a NAND type memory cell transistor group CELLAx1 will be described. First, when the clock signal CLK changes to the H level from the L level at t3 of FIG. 16B, the bit line b1 is precharged. When the clock signal CLK changes to the L level at t4 in this state, the signal flowing through the selection line SELn-1, the signal flowing through the selection line Disn-1, and the signal RST1 indicate the L level, and the signal flowing through the word lines WL0 to WL7, the signal flowing through the selection line Disn, the signal flowing through the selection line SELn, and the signals RST0, RST2 to RST7 indicate the H level.

Then, the selector transistors Trd1X and Ts1X have the turned on state between the source and drain, and the data is read from the NAND type memory cell Mb1. The NAND type memory cell Mb1 has the on-state, the bit line discharge transistor TR1 has the off-state, and the potential of the bit line b1 precharged at the H level is discharged to the common source line SL via the selector transistor Ts1X, NAND type memory cell Mb1, and selector transistor Trd1X. As a result, the bit line b1 is discharged, and lowered to the VSS level. Therefore, the signal of the L level of the bit line b1 is inputted into the sense circuit S.

Moreover, when the clock signal CLK at the time of the read of the NAND type memory cell Mb1 indicates the L level at t4 to t5, the bit lines b0, b2 to b7 are fixed at the VSS level via the bit line discharge transistors TR0, TR2 to TR7.

In the above-described circuit operation, the parasitic resistance exists even during the read of the NAND type memory cell Mb1. However, since the number of precharged bit lines is only 16 among 512 lines in the whole memory cell array, the synthesized resistance of the parasitic resistances of 16 NAND type memory cells is micro as compared with the resistance RSL. Therefore, since the precharged electric charge flows through the common source line SL only from 16 bit lines, needless to say, the level float of the common source line SL held at the VSS level is micro.

As described above, according to the embodiment of the present invention, the bit lines other than those in the read address are forcibly set, for example, to the VSS level in the read mode, and the number of bit lines to be simultaneously discharged via the common source line SL is remarkably small. Therefore, the level float of the common source line SL can be ignored, and the garble defect of the read data "1" to "0" at the time of the read of the memory cell data having the on-state is eliminated. Furthermore, the non-read bit lines are fixed at the VSS level. As a result, the level drop of the dynamic data "1" is not caused even after the precharge transistor is turned off by the capacity coupling between the bit lines disposed adjacent to the selected bit line, and the garble defect of the read data "0" to "1" at the time of the read of the memory cell data having the off-state is eliminated. Accordingly, the memory circuit apparatus can be used in a microcomputer system requiring a steady read operation especially with a large-capacity memory. Since it is not necessary to excessively increase the W size of the transistor for the SL line discharge, the layout of a control circuit between the common source line SL and the VSS level ground can easily be designed. A period for designing the layout so as to reduce the parasitic resistance of the common source line SL can be reduced, and a power supply wiring width increase for the reduction of the parasitic resistance of the common source line SL and a contact size increase can be reduced. Therefore, a memory circuit apparatus macro size can be prevented from being enlarged. When the memory circuit apparatus of the embodiment of the present invention is incorporated into a memory loaded MCU chip, a chip size increase can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A memory circuit apparatus comprising:
a plurality of memory cells connected to a plurality of bit lines and word lines;
an access circuit connected to the plurality of bit lines and word lines to select predetermined memory cells from the plurality of memory cells in response to an address signal;
a precharge circuit which precharges the bit lines connected to the memory cells selected by the access circuit at the time of a read mode;
a common source line connected to a plurality of selected memory cells selected by the access circuit;
a source line potential control circuit to connect the common source line to a ground node at a predetermined timing; and
a discharge circuit which discharges the bit lines connected to non-selected memory cells other than the selected memory cells.

2. The memory circuit apparatus according to claim 1, wherein the discharge circuit is connected to the bit lines connected to the non-selected memory cells, and includes a plurality of discharge transistors to fix these bit lines at a ground potential.

3. The memory circuit apparatus according to claim 2, wherein the discharge circuit includes a decoder circuit which receives the address signal and a discharge permission signal as inputs and which produces an on signal to be supplied to the discharge transistors.

4. The memory circuit apparatus according to claim 1, wherein one end of the bit line is connected to a precharge power supply via the access circuit and precharge circuit, and the other end of the bit line is connected to a ground node via the memory cell and the source line potential control circuit.

5. The memory circuit apparatus according to claim 1, wherein the source line potential control circuit includes a switching device controlled to turn on/off by a source line potential control signal, and connects the source line to the ground potential, when the switching device turns on.

6. The memory circuit apparatus according to claim 1, wherein the memory cell comprises a nonvolatile memory cell constituting $E^2PROM$.

7. The memory circuit apparatus according to claim 1, wherein the memory cell comprises a MOS transistor in which a source is selectively connected to a drain via a metal wiring, and constitutes a NOR type MROM.

8. The memory circuit apparatus according to claim 1, wherein the memory cell comprises a MOS transistor in which a source is selectively connected to a drain via a metal wiring, and constitutes a NAND type MROM.

9. The memory circuit apparatus according to claim 1, wherein the access circuit includes a column decoder which selects a predetermined bit line by an input address signal, and the discharge circuit supplies an off signal to a discharge transistor connected to a predetermined bit line selected by the same input address signal as that of the column decoder.

10. The memory circuit apparatus according to claim 9, wherein the discharge circuit includes a decode circuit which produces the same decoded output as that of the column decoder, and an inverter which reverses a polarity of the output of the decode circuit.

11. The memory circuit apparatus according to claim 1, wherein the plurality of memory cells are grouped/divided in a plurality of memory blocks, and the memory cells in each block are further grouped/divided into a plurality of words.

* * * * *